US012776764B2

(12) United States Patent
Cohen et al.

(10) Patent No.: US 12,776,764 B2
(45) **Date of Patent: *Oct. 27, 2026**

(54) QUANTUM CONTROLLER WITH MODULAR AND DYNAMIC PULSE GENERATION AND ROUTING

(71) Applicant: Quantum Machines, Tel Aviv (IL)

(72) Inventors: Yonatan Cohen, Tel Aviv (IL); Nissim Ofek, Tel Aviv (IL); Itamar Sivan, Tel Aviv (IL)

(73) Assignee: Q.M Technologies Ltd. (IL)

( * ) Notice: Subject to any disclaimer, the term of this patent is extended or adjusted under 35 U.S.C. 154(b) by 112 days.

This patent is subject to a terminal disclaimer.

(21) Appl. No.: 18/829,370

(22) Filed: Sep. 10, 2024

(65) Prior Publication Data

US 2025/0125793 A1 Apr. 17, 2025

Related U.S. Application Data

(63) Continuation of application No. 18/364,848, filed on Aug. 3, 2023, now Pat. No. 12,088,302, which is a (Continued)

(51) Int. Cl.
*H03K 3/38* (2006.01)
*G06F 13/36* (2006.01)
(Continued)

(52) U.S. Cl.
CPC ............... *H03K 3/38* (2013.01); *G06F 13/36* (2013.01); *G06F 15/80* (2013.01); *G06F 15/82* (2013.01);
(Continued)

(58) Field of Classification Search
CPC ........... H03K 3/02; H03K 3/38; H03K 17/51; H03K 17/92; H03K 19/02; H03K 19/195
See application file for complete search history.

(56) References Cited

U.S. PATENT DOCUMENTS

| | | | |
|---|---|---|---|
| 4,875,484 | A | 10/1989 | Anzai et al. |
| 5,063,354 | A | 11/1991 | Lauper et al. |

(Continued)

FOREIGN PATENT DOCUMENTS

| | | | |
|---|---|---|---|
| CA | 2420022 | A1 | 2/2003 |
| CN | 1808103 | A | 7/2006 |

(Continued)

OTHER PUBLICATIONS

Lavoie et al., "A Formalization for Specifying and Implementing Correct Pull-Stream Modules," in arXiv preprint arXiv: 1801.06144 (2018). (Year: 2018).

(Continued)

*Primary Examiner* — Jason M Crawford
(74) *Attorney, Agent, or Firm* — McAndrews Held & Malloy, Ltd.

(57) ABSTRACT

A controller comprises a pulse generation circuit, output management circuitry, and a plurality of outputs configured to connect the controller to a plurality of controlled elements. The pulse generation circuit is configured to generate quantum control pulses. For each control pulse of a plurality of control pulses generated by the pulse generation circuit, the output management circuitry is configured to determine to which of the plurality of outputs to route the control pulse such that a first of the plurality of control pulses is routed to a first of the plurality of controlled elements and a second of the plurality of control pulses is routed to a second of the plurality of control elements.

20 Claims, 7 Drawing Sheets

Related U.S. Application Data continuation of application No. 17/541,523, filed on Dec. 3, 2021, now Pat. No. 11,750,179, which is a continuation of application No. 16/848,965, filed on Apr. 15, 2020, now Pat. No. 11,245,389, which is a continuation of application No. 16/451,683, filed on Jun. 25, 2019, now Pat. No. 10,637,449, which is a continuation of application No. 16/199,981, filed on Nov. 26, 2018, now Pat. No. 10,333,503.

(51) Int. Cl.

| | |
|---|---|
| ***G06F 15/80*** | (2006.01) |
| ***G06F 15/82*** | (2006.01) |
| ***G06N 10/40*** | (2022.01) |
| ***G06N 10/60*** | (2022.01) |
| ***G06N 10/80*** | (2022.01) |
| ***H03K 19/195*** | (2006.01) |

(52) U.S. Cl.

CPC ............ *G06N 10/40* (2022.01); *G06N 10/60* (2022.01); *G06N 10/80* (2022.01); *H03K 19/195* (2013.01)

(56) References Cited

U.S. PATENT DOCUMENTS

| | | | | |
|---|---|---|---|---|
| 5,194,907 | A | 3/1993 | Hayashi | |
| 5,684,418 | A | 11/1997 | Yanagiuchi | |
| 6,223,228 | B1 | 4/2001 | Ryan et al. | |
| 6,426,984 | B1 | 7/2002 | Perino et al. | |
| 6,993,108 | B1 | 1/2006 | Chi et al. | |
| 7,451,292 | B2 | 11/2008 | Routt | |
| 7,535,931 | B1 | 5/2009 | Zampetti et al. | |
| 7,627,126 | B1 | 12/2009 | Pikalo | |
| 8,315,969 | B2 | 11/2012 | Roetteler | |
| 8,385,878 | B2 | 2/2013 | Rao | |
| 8,750,717 | B1 | 6/2014 | Yap et al. | |
| 8,929,467 | B1 | 1/2015 | Xiu | |
| 9,207,672 | B2 | 12/2015 | Williams | |
| 9,400,499 | B2 | 7/2016 | Williams | |
| 9,509,324 | B2 | 11/2016 | McDonald et al. | |
| 9,663,358 | B1 | 5/2017 | Cory et al. | |
| 9,692,423 | B2 | 6/2017 | McDermott, III | |
| 9,847,121 | B2 | 12/2017 | Frank | |
| 9,858,531 | B1 | 1/2018 | Monroe | |
| 9,892,365 | B2 | 2/2018 | Rigetti | |
| 9,978,020 | B1 | 5/2018 | Gambetta | |
| 9,979,400 | B1 | 5/2018 | Sete | |
| 9,996,801 | B2 | 6/2018 | Shim | |
| 10,063,228 | B2 | 8/2018 | Deurloo et al. | |
| 10,122,351 | B1 | 11/2018 | Naaman | |
| 10,127,499 | B1 | 11/2018 | Rigetti | |
| 10,192,168 | B2 | 1/2019 | Rigetti | |
| 10,223,643 | B1 | 3/2019 | Bishop et al. | |
| 10,333,503 | B1 * | 6/2019 | Cohen | H03K 3/38 |
| 10,454,459 | B1 | 10/2019 | Cohen | |
| 10,496,069 | B2 | 12/2019 | Nazarathy et al. | |
| 10,505,524 | B1 | 12/2019 | Cohen | |
| 10,560,076 | B1 | 2/2020 | Cohen | |
| 10,637,449 | B1 * | 4/2020 | Cohen | H03K 3/38 |
| 10,659,018 | B1 | 5/2020 | Cohen | |
| 10,666,238 | B1 | 5/2020 | Cohen | |
| 10,958,253 | B1 | 3/2021 | Cohen et al. | |
| 10,985,739 | B2 | 4/2021 | Cohen et al. | |
| 11,010,145 | B1 | 5/2021 | Smith et al. | |
| 11,043,939 | B1 * | 6/2021 | Szmuk | H03K 19/195 |
| 11,115,043 | B1 | 9/2021 | Simon et al. | |
| 11,164,100 | B2 * | 11/2021 | Cohen | G06N 10/40 |
| 11,245,389 | B2 * | 2/2022 | Cohen | H03K 3/38 |
| 11,463,075 | B2 | 10/2022 | Cohen et al. | |
| 11,616,497 | B2 | 3/2023 | Cohen et al. | |
| 11,616,498 | B2 | 3/2023 | Cohen et al. | |
| 11,750,179 | B2 * | 9/2023 | Cohen | H03K 3/38 326/1 |
| 12,088,302 | B2 * | 9/2024 | Cohen | H03K 3/38 |
| 2002/0004876 | A1 | 1/2002 | Timmer et al. | |
| 2004/0266084 | A1 | 12/2004 | Fujishima et al. | |
| 2005/0015422 | A1 | 1/2005 | Kohn et al. | |
| 2005/0180575 | A1 | 8/2005 | Maeda et al. | |
| 2006/0093376 | A1 | 5/2006 | Mitchell et al. | |
| 2008/0037693 | A1 | 2/2008 | Andrus et al. | |
| 2009/0268901 | A1 | 10/2009 | Lodewyck et al. | |
| 2010/0072979 | A1 | 3/2010 | Fefer et al. | |
| 2011/0035511 | A1 | 2/2011 | Biederman | |
| 2011/0239034 | A1 | 9/2011 | Okuda | |
| 2013/0198499 | A1 | 8/2013 | Dice et al. | |
| 2016/0125311 | A1 | 5/2016 | Fuechsle et al. | |
| 2016/0267032 | A1 | 9/2016 | Rigetti et al. | |
| 2016/0292586 | A1 | 10/2016 | Rigetti et al. | |
| 2017/0094618 | A1 | 3/2017 | Bjorkengren | |
| 2017/0104528 | A1 | 4/2017 | Wu et al. | |
| 2017/0214410 | A1 | 7/2017 | Hincks et al. | |
| 2017/0364796 | A1 | 12/2017 | Wiebe | |
| 2018/0013426 | A1 | 1/2018 | Deurloo et al. | |
| 2018/0032893 | A1 | 2/2018 | Epstein | |
| 2018/0091244 | A1 | 3/2018 | Abdo | |
| 2018/0107579 | A1 | 4/2018 | Chapman | |
| 2018/0123597 | A1 | 5/2018 | Sete | |
| 2018/0237039 | A1 | 8/2018 | Mong et al. | |
| 2018/0260245 | A1 | 9/2018 | Smith | |
| 2018/0260730 | A1 | 9/2018 | Reagor | |
| 2018/0260732 | A1 | 9/2018 | Bloom | |
| 2018/0308007 | A1 | 10/2018 | Amin | |
| 2018/0322409 | A1 | 11/2018 | Barends | |
| 2018/0365585 | A1 | 12/2018 | Smith | |
| 2018/0373995 | A1 | 12/2018 | Tomaru et al. | |
| 2018/0375650 | A1 | 12/2018 | Legre | |
| 2019/0042964 | A1 | 2/2019 | Elsherbini et al. | |
| 2019/0042965 | A1 | 2/2019 | Clarke | |
| 2019/0042970 | A1 | 2/2019 | Zou | |
| 2019/0042971 | A1 | 2/2019 | Zou | |
| 2019/0042972 | A1 | 2/2019 | Zou | |
| 2019/0042973 | A1 | 2/2019 | Zou | |
| 2019/0049495 | A1 * | 2/2019 | Ofek | G01R 33/1284 |
| 2019/0251478 | A1 | 8/2019 | Bishop et al. | |
| 2019/0266512 | A1 | 8/2019 | Shen et al. | |
| 2019/0302832 | A1 | 10/2019 | Morgan et al. | |
| 2019/0317589 | A1 | 10/2019 | Mathur et al. | |
| 2019/0385088 | A1 | 12/2019 | Naaman et al. | |
| 2020/0287525 | A1 | 9/2020 | Cohen et al. | |
| 2020/0293080 | A1 | 9/2020 | Poon et al. | |
| 2020/0364602 | A1 | 11/2020 | Niu et al. | |
| 2021/0004707 | A1 | 1/2021 | Gambetta et al. | |
| 2021/0018272 | A1 | 1/2021 | Inagaki et al. | |
| 2021/0091755 | A1 | 3/2021 | Cohen et al. | |
| 2021/0103847 | A1 | 4/2021 | Akzam | |
| 2021/0125096 | A1 | 4/2021 | Puri et al. | |
| 2021/0359670 | A1 | 11/2021 | Cohen et al. | |
| 2021/0391851 | A1 * | 12/2021 | Cohen | G06N 3/02 |
| 2022/0357948 | A1 | 11/2022 | Cohen et al. | |
| 2023/0244459 | A1 | 8/2023 | Zou et al. | |
| 2024/0063779 | A1 * | 2/2024 | Cohen | H03K 3/38 |
| 2025/0125793 | A1 * | 4/2025 | Cohen | H03K 3/38 |

FOREIGN PATENT DOCUMENTS

| | | | |
|---|---|---|---|
| CN | 104467843 | A | 3/2015 |
| CN | 105281886 | A | 1/2016 |
| CN | 105912070 | A | 8/2016 |
| CN | 107408223 | A | 11/2017 |
| CN | 108111306 | A | 6/2018 |
| CN | 108594214 | A | 9/2018 |
| CN | 108698815 | A | 10/2018 |
| CN | 109165744 | A | 1/2019 |
| CN | 110085094 | A | 8/2019 |
| CN | 108780129 | A | 11/2019 |
| CN | 110677210 | A | 1/2020 |
| CN | 111464154 | A | 7/2020 |
| CN | 111767055 | A | 10/2020 |
| CN | 112019193 | A | 12/2020 |
| CN | 112149832 | A | 12/2020 |
| EP | 0388052 | A2 | 9/1990 |
| JP | 09-321747 | A | 12/1997 |

(56) References Cited

FOREIGN PATENT DOCUMENTS

| | | | |
|---|---|---|---|
| JP | 2000-49759 | A | 2/2000 |
| JP | 2007049009 | A | 2/2007 |
| JP | 2009-68949 | A | 4/2009 |
| JP | 2011175078 | A | 9/2011 |
| JP | 2011-211412 | A | 10/2011 |
| JP | 2012188875 | A | 10/2012 |
| JP | 2018137739 | A | 8/2018 |
| WO | 2015178991 | A2 | 11/2015 |
| WO | 2015178992 | A2 | 11/2015 |
| WO | 2017078735 | A1 | 5/2017 |
| WO | 2017123940 | A | 7/2017 |
| WO | 2017139683 | A1 | 8/2017 |
| WO | 2018055607 | A1 | 3/2018 |
| WO | 2018062991 | A1 | 4/2018 |
| WO | 2019063117 | A1 | 4/2019 |
| WO | 2020033807 | A1 | 2/2020 |
| WO | 2020231795 | A1 | 11/2020 |
| WO | 2021123903 | A1 | 6/2021 |
| WO | 2025/07878 | A1 | 1/2025 |

OTHER PUBLICATIONS

Fu et al., “A Microarchitecture for a Superconducting Quantum Processor,” in 38.3 I EEE Micro 40-47 (2018). (Year: 2018).

Extended European Search Report Appln No. 20845965.1 dated Jun. 29, 2023.

European Office Communication with extended Search Report Appln No. 20861242.4 dated Jul. 7, 2023.

European Office Communication with extended Search Report Appln No. 23153085.8 dated Jul. 3, 2023.

Yang Yet al: “FPGA-based electronic system for the control and readout of superconducting qubit systems”, arxiv.org, Cornell University Library, 201 Yang Yet al: “FPGA-based electronic system for the control and readout of superconducting qubit systems”, arxiv.org, Cornell University Library, 201 Olin Library Cornell University Ithaca, NY 14853, Oct. 15, 2021 (Oct. 15, 2021), XP091078848.

Gebauer Richard et al: “A modular RFSoC-based approach to interface superconducting quantum bits”, 2021 International Conference on Field-Programmable Technology (ICFPT), IEEE, Dec. 6, 2021 (Dec. 6, 2021), pp. 1-9, XP034028257, DOI: 10.1109/ICFPT52863.2021.9609909 [retrieved on Nov. 8, 2021].

European Office Communication with extended Search Report Appln No. 20861100.4 dated Jul. 21, 2023.

Fu et al. “eQASM: An Executable Quantum 1-15 Instruction Set Architecture”, 2019 IEEE International Symposium on High Performance Computer Architecture (HPCA), IEEE Feb. 16, 2019 (Feb. 16, 2019), pp. 224-237, XP033532496, DOI: 10.1109/HPCA.2019.00040 Retrieved from the Internet: URL: https://ieeexplore.ieee.org/abstract/document/8675197/authors#authors [retrieved on Mar. 26, 2019].

Yunong Shi et al: “Optimized Compilation of Aggregated Instructions for Realistic Quantum Computers”, arxiv.org, Cornell University Library, 201 Olin Library Cornell University Ithaca, NY 14853, Feb. 4, 2019 (Feb. 4, 2019), XP081025321, DOI: 10.1145/3297858.3304018.

Chinese Patent Office Action Appln No. 2019800888907 with search report dated Jul. 28, 2023 with translation.

European Office Communication with extended Search Report Appln No. 20869503.1 dated Sep. 12, 2023.

Chinese Office Action Appln No. 2019800902340 with search report dated Aug. 30, 2023 with translation.

Int’l Preliminary Report on Patentability Appln No. PCT/IB2022/050190 mailed Oct. 19, 2023.

Int’l Preliminary Report on Patentability Appln No. PCT/IB2022/000068 mailed Nov. 23, 2023.

Int’l Preliminary Report on Patentability Appln No. PCT/IB2022/000059 mailed Nov. 23, 2023.

Int’l Preliminary Report on Patentability Appln No. PCT/IB2022/000024 mailed Nov. 9, 2023.

European Office Communication with extended Search Report Appln No. 20902662.4.6 dated Dec. 21, 2023.

Int’l Preliminary Report on Patentability Appln No. PCT/IB2022/054903 mailed Dec. 28, 2023.

Int’l Preliminary Report on Patentability Appln No. PCT/IB2022/053304 mailed Feb. 1, 2024.

Chinese Office Action Appln No. 2019800888907 dated Nov. 17, 2023.

Japanese Patent Office Action Appln No. 2023-042662 dated Apr. 22, 2024 with translation.

Extended European Search Report Appln No. 22795078.9 dated Feb. 7, 2025.

Int’l Search Report and Written Opinion Appln No. PCT/IB2024/062016 mailed Apr. 9, 2025.

W. D. Kalfus et al., “High-Fidelity Control of Superconducting Qubits Using Direct Microwave Synthesis in Higher Nyquist Zones,” in IEEE Transactions on Quantum Engineering, vol. 1, pp. 1-12, 2020, Art No. 6002612, doi: 10.1109/TQE.2020.3042895. W. D. Kalfus et al. Dec. 8, 2020 (Dec. 8, 2020).

Japanese Office Action Appln No. 2024-503888 dated Mar. 7, 2025.

Chinese Office Action No. 2020800552759 dated Mar. 13, 2025.

Kang et al. ISSCC (IEEE) 20231 Session 341 Cryo-CMOS for Quantum Computing 134.4 A Cryogenic Controller IC for Superconducting Qubits with DRAG Pulse Generation by Direct Synthesis without Using (Year: 2023).

European Office Action with partial search report Appln No. 22845504.4 dated May 7, 2025.

Int’l Search Report and Written Opinion Appln No. PCT/IB2025/052018 mailed Jun. 8, 2025.

DiVincenzo, David P., “The Physical Implementation of Quantum Computation,” arXiv:quant-ph/0002077v3, Dec. 12, 2001, 9 pgs. (Year: 2001).

Li et al., Optimal pulse design in quantum control: A unified computational method, PNAS, vol. 108, No. 5, Feb. 1, 2011, pp. 1879-1884. (Year: 2011).

McCaskey et al., “A Language and Hardware Independent Approach to Quantum-Classical Computing,” arXiv: 1701.01794v2, Aug. 1, 2018, 15 pgs. (Year: 2018).

Korean Office Action Appln No. 10-2021-7019501 dated Jun. 9, 2025.

U.S. Appl. No. 62/294,966, filed Feb. 12, 2016.

Int’l Search Report and Written Opinion Appln No. PCT/IB2019/001410 mailed Jun. 10, 2020.

Int’l Search Report and Written Opinion Appln No. PCT/IB2019/001394 mailed Jun. 17, 2020.

Zhang J, Hegde SS, Suter D. Pulse sequences for controlled 2-and 3-qubit gates in a hybrid quantum register. arXiv preprint arXiv:1806.08408. Jun. 21, 2018.

Wang CY, Kuznetsova L, Gkortsas VM, Diehl L, Kaertner FX, Belkin MA, Belyanin A, Li X, Ham D, Schneider H, Grant P. Mode-locked pulses from mid-infrared quantum cascade lasers. Optics Express. Jul. 20, 2009; 17(15):12929-43.

Int’l Search Report and Written Opinion Appln No. PCT/IB2020/000218 mailed Aug. 11, 2020.

Quan R, Zhai Y, Wang M, Hou F, Wang S, Xiang X, Liu T, Zhang S, Dong R. Demonstration of quantum synchronization based on second-order quantum coherence of entangled photons. Scientific reports. Jul. 25, 2016;6:30453. Jul. 25, 2016 (Jul. 25, 2016).

Int’l Search Report and Written Opinion Appln No. PCT/IB2020/000376 mailed Sep. 17, 2020.

Breitfelder et al. eds., IEEE 100: The Authoritative Dictionary of IEEE Standards Terms 1247, definition 2 of “variable” (7th ed. 2000). (Year: 2000).

Int’l Search Report and Written Opinion Appln No. PCT/IB2020/000707 mailed Jan. 12, 2021.

National Academies of Sciences, Engineering, and Medicine. “Quantum Computing: Progress and Prospects”. eprint (Dec. 2018) [online]. [retrieved on Jan. 7, 2020]. retrieved from: <https://doi.org/10.17226/25196.> Dec. 4, 2018 (Dec. 4, 2018) pp. 114, 142, 210, Fig. 2.5, Qiskit Backend Specifications at footnote 57: section 4.2, 5.1.5, Fig. 3, Fig. 4, pp. 30, 57.

IBM Research. “Qiskit Backend Specifications for OpenQASM and OpenPulse Experiments”. eprint arXiv:1809.03452v1 (Sep. 10,

(56) References Cited

OTHER PUBLICATIONS

2018) [online]. [retrieved on Jan. 7, 2020]. retrieved from: <https://arxiv.org/pdf/1809.03452.pdf> Sep. 10, 2018 (Sep. 10, 2018) section 4.2, 5.1.5, Fig. 3, Fig. 4 , pp. 30, 57.
Int'l Search Report and Written Opinion Appln No. PCT/IB2020/000704 mailed Jan. 17, 2021.
Wolfowicz, et al. Pulse Techniques for Quantum Information Processing University of Chicago, University College London, eMagRes, 2016, vol. 5: 1515-1528. DOI 10.1002/9780470034590.emrstm1521.
Int'l Search Report and Written Opinion Appln No. PCT/IB2020/000555 mailed Dec. 27, 2020.
Int'l Search Report and Written Opinion Appln No. PCT/IB2020/000760 mailed Jan. 27, 2021.
"Quantum-classical interface based on single flux quantum digital logic". In: Quantum Science and Technology 3.2 (2018), pp. 1-16. DOI: 10.1088/2058-9565/aaa3a0.(retrieved on Jan. 20, 2021). Retrieved from the Internet: < https://arxiv.org/pdf/1710.04645.pdf > McDermott R. et al. Oct. 12, 2017 (Oct. 12, 2017) Section VI, VII, VIII.
Roffe, J., Quantum Error Correction: An Introductory Guide, Dept. of Physics & Astronomy, Univ. of Sheffeld, UK, Oct. 10, 2019, pp. 1-29.
Int'l Search Report and Written Opinion Appln No. PCT/IB2020/001004 mailed May 13, 2021.
Int'l Preliminary Report on Patentability Appln No. PCT/IB2019/001410 mailed Jun. 10, 2021.
Int'l Search Report and Written Opinion Appln No. PCT/IB2021/000067 mailed Jun. 21, 2021.
Int'l Preliminary Report on Patentability Appln No. PCT/IB2019/001394 mailed Jul. 29, 2021.
Int'l Preliminary Report on Patentability Appln No. PCT/IB2020/000218 mailed Sep. 16, 2021.
Int'l Preliminary Report on Patentability Appln No. PCT/IB2020/000376 mailed Nov. 12, 2021.
Int'l Search Report and Written Opinion Appln No. PCT/IB2021/056254 mailed Dec. 1, 2021.
Ribeiro, Diogo C., Pedro M. Cruz, and Nuno Borges Carvalho, "Towards a denser frequency grid in phase measurements using mixer-based receivers." 2015 85th Microwave Measurement Conference (ARFTG). IEEE, 2015. Dec. 31, 2015 (Dec. 31, 2015).
Int'l Preliminary Report on Patentability Appln No. PCT/IB2020/000555 mailed Feb. 10, 2022.
Int'l Preliminary Report on Patentability Appln No. PCT/IB2020/000707 mailed Mar. 17, 2022.
Int'l Preliminary Report on Patentability Appln No. PCT/IB2020/000704 mailed Mar. 17, 2022.
Int'l Preliminary Report on Patentability Appln No. PCT/IB2020/000760 mailed Apr. 7, 2022.
Int'l Search Report and Written Opinion Appln No. PCT/IB2022/050190 mailed Apr. 11, 2022.
Int'l Search Report and Written Opinion Appln No. PCT/IB2022/000059 mailed Jul. 7, 2022.
Moreira , "QuTech Central Controller: A Quantum Control Architecture for a Surface-17 Logical Qubit." Delft University of Technology Student Theses Collection (2019). Available at the following URL: http://resolver.tudelft.nl/uuid:502ed5e5-87f7-42bd-a077-c24b7281cd94 May 10, 2019 (May 10, 2019).
Int'l Preliminary Report on Patentability Appln No. PCT/IB2020/001004 mailed Jun. 30, 2022.
Int'l Search Report and Written Opinion Appln No. PCT/IB2022/000024 mailed Jul. 18, 2022.
Baier, Simon, Matteo Pompili, Sophie LN Hermans, Hans KC Beukers, Peter C. Humphreys, Raymond N. Schouten, Raymond FL Vermeulen et al. "Realization of a Multi-Node Quantum Network of Remote Solid-State Qubits", Science, vol. 372, pp. 259-264 (2021) Baier Simon Apr. 16, 2021 (Apr. 16, 2021).
Int'l Search Report and Written Opinion Appln No. PCT/IB2022/000068 mailed Jul. 17, 2022.
D. Copsey et al., "Toward a scalable, silicon-based quantum computing architecture," in IEEE Journal of Selected Topics in Quantum Electronics, vol. 9, No. 6, pp. 1552-1569, Nov.-Dec. 2003, doi: 10.1109/JSTQE.2003.820922. Dec. 31, 2003 (Dec. 31, 2003).
Extended European Search Report Appln No. 19889443.8 dated Aug. 4, 2022.
Int'l Search Report and Written Opinion Appln No. PCT/IB2022/054903 mailed Sep. 8, 2022.
Int'l Preliminary Report on Patentability Appln No. PCT/IB2021/000067 mailed Sep. 22, 2022.
Int'l Search Report and Written Opinion Appln No. PCT/IB2022/053304 mailed Oct. 6, 2022.
Serrano, Javier, M. Lipinski, T. Wlostowski, E. Gousiou, Erik van der Bij, M. Cattin, and G. Daniluk. "The white rabbit project." (2013) Sep. 19, 2013 (Sep. 19, 2013) Entire document.
Extended European Search Report Appln No. 19910800.2 dated Oct. 6, 2022.
Hornibrook J Met al: "Cryogenic Control Architecture for Large-Scale Quantum Computing", arxiv.org, Cornell University Library, 201 Olin Library Cornell University Ithaca, NY 14853, Sep. 8, 2014 (Sep. 8, 2014), XP081391509.
Fu X et al: "An Experimental Microarchitecture for a Superconducting Quantum Processor", Micro-50 '17: Proceedings of the 50th Annual IEEE/ACM International Symposium on Microarchitecture, Cornell University Library, 201 Olin Library Cornell University Ithaca, NY 14853, Oct. 14, 2017 (Oct. 14, 2017), pp. 1-13, XP081291220.
Zopes J. et al: "High resolution quantum sensing with shaped control pulses", arxiv.org, Cornell University Library, 201 Olin Library Cornell University Ithaca, NY 14853, May 22, 2017 (May 22, 2017), XP081276850.
Cross et al. "Open Quantum Assembly Language", Jan. 10, 2017.
European Office Communication with extended Search Report Appln No. 20766036.6 dated Nov. 24, 2022.
Japanese Patent Office Action Appln No. 2021-529723 dated Oct. 26, 2022 with translation.

* cited by examiner

QUANTUM CONTROLLER WITH MODULAR AND DYNAMIC PULSE GENERATION AND ROUTING

PRIORITY CLAIM

This application is a continuation of U.S. patent application Ser. No. 18/364,848 filed Aug. 3, 2023 (now U.S. Pat. No. 12,088,302), which is a continuation of U.S. patent application Ser. No. 17/541,523 filed Dec. 3, 2021 (now U.S. Pat. No. 11,750,179), which is a continuation of U.S. patent application Ser. No. 16/848,965 filed Apr. 15, 2020 (now U.S. Pat. No. 11,245,389), which is a continuation of U.S. patent application Ser. No. 16/451,683 filed Jun. 25, 2019 (now U.S. Pat. No. 10,637,449), which is a continuation of Ser. No. 16/199,981 filed Nov. 26, 2018 (now U.S. Pat. No. 10,333,503). Each of the aforementioned documents is hereby incorporated herein by reference in its entirety.

TECHNICAL FIELD

Aspects of the present application relate to quantum computer control systems. More specifically, to methods and systems for a quantum controller with dynamic pulse routing.

BACKGROUND

Limitations and disadvantages of conventional approaches to quantum computer control systems will become apparent to one of skill in the art, through comparison of such approaches with some aspects of the present method and system set forth in the remainder of this disclosure with reference to the drawings.

BRIEF SUMMARY

Methods and systems are provided for a quantum controller with modular and dynamic pulse generation and routing, substantially as illustrated by and/or described in connection with at least one of the figures, as set forth more completely in the claims.

DETAILED DESCRIPTION

Classical computers operate by storing information in the form of binary digits ("bits") and processing those bits via binary logic gates. At any given time, each bit takes on only one of two discrete values: 0 (or "off") and 1 (or "on"). The logical operations performed by the binary logic gates are defined by Boolean algebra and circuit behavior is governed by classical physics. In a modern classical system, the circuits for storing the bits and realizing the logical operations are usually made from electrical wires that can carry two different voltages, representing the 0 and 1 of the bit, and transistor-based logic gates that perform the Boolean logic operations.

Figure 1A:
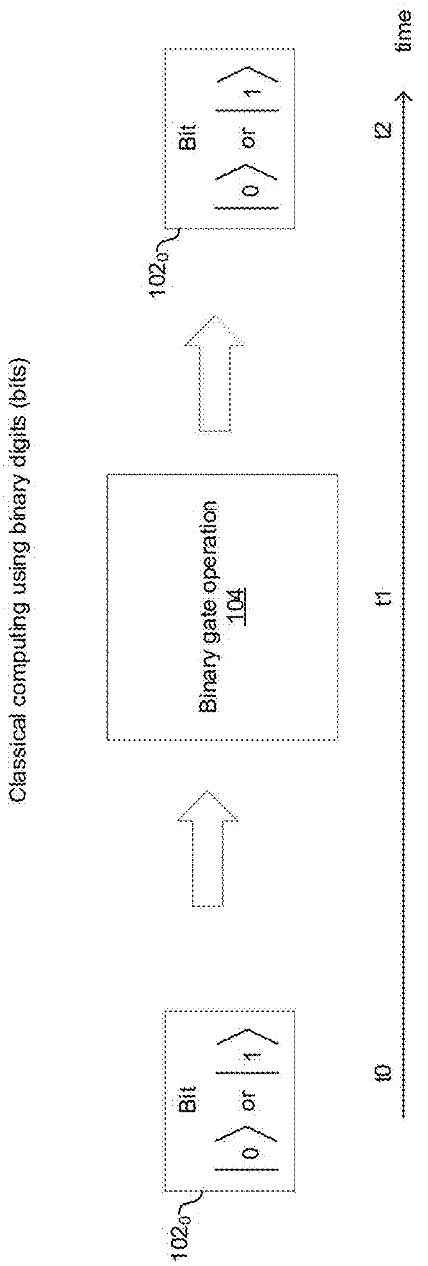
FIGS. 1A and 1B compare some aspects of classical (binary) computing and quantum computing.

Shown in FIG. 1A is a simple example of a classical computer configured to a bit 102 and apply a single logic operation 104 to the bit 102. At time t0 the bit 102 is in a first state, at time t1 the logic operation 104 is applied to the bit 102, and at time t2 the bit 102 is in a second state determined by the state at time t0 and the logic operation. So, for example, the bit 102 may typically be stored as a voltage (e.g., 1 Vdc for a "1" or 0 Vdc for a "0") which is applied to an input of the logic operation 104 (comprised of one or more transistors). The output of the logic gate is then either 1Vdc or 0Vdc, depending on the logic operation performed.

Obviously, a classical computer with a single bit and single logic gate is of limited use, which is why modern classical computers with even modest computation power contain billions of bits and transistors. That is to say, classical computers that can solve increasingly complex problems inevitably require increasingly large numbers of bits and transistors and/or increasingly long amounts of time for carrying out the algorithms. There are, however, some problems which would require an infeasibly large number of transistors and/or infeasibly long amount of time to arrive at a solution. Such problems are referred to as intractable.

Quantum computers operate by storing information in the form of quantum bits ("qubits") and processing those qubits via quantum gates. Unlike a bit which can only be in one state (either 0 or 1) at any given time, a qubit can be in a superposition of the two states at the same time. More precisely, a quantum bit is a system whose state lives in a two dimensional Hilbert space and is therefore described as a linear combination $\alpha|0>+\beta|1>$, where $|0>$ and $|1>$ are two basis states, and $\alpha$ and $\beta$ are complex numbers, usually called probability amplitudes, which satisfy $|\alpha|^2+|\beta|^2=1$. Using this notation, when the qubit is measured, it will be 0 with probability $|\alpha|^2$ and will be 1 with probability $|\beta|^2$. $|0\rangle$ and $|1\rangle$ can also be represented by two-dimensional basis vectors $$\begin{bmatrix}1\\0\end{bmatrix} \text{ and } \begin{bmatrix}0\\1\end{bmatrix},$$

respectively, and then the qubit state is represented by $$\begin{bmatrix}\alpha\\\beta\end{bmatrix}.$$

The operations performed by the quantum gates are defined by linear algebra over Hilbert space and circuit behavior is governed by quantum physics. This extra richness in the mathematical behavior of qubits and the operations on them, enables quantum computers to solve some problems much faster than classical computers (in fact some problems that are intractable for classical computers may become trivial for quantum computers).

Figure 1B:
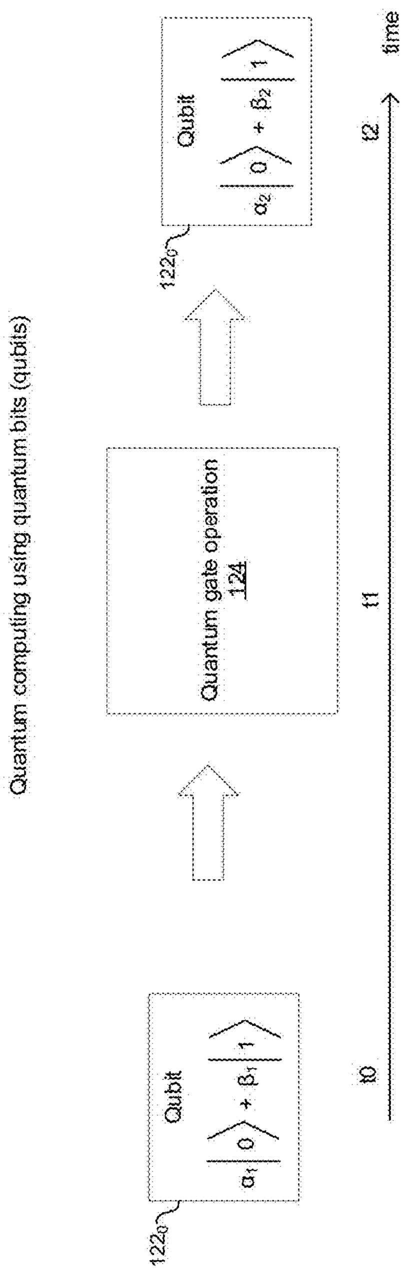

Shown in FIG. 1B is a simple example of a quantum computer configured to store a qubit 122 and apply a single quantum gate operation 124 to the qubit 122. At time to the qubit 122 is described by $\alpha_1|0\rangle + \beta_1|1\rangle$, at time t1 the logic operation 104 is applied to the qubit 122, and at time t2 the qubits 122 is described by $\alpha_2|0\rangle + \beta_2|1\rangle$.

Unlike a classical bit, a qubit cannot be stored as a single voltage value on a wire. Instead, a qubit is physically realized using a two-level quantum mechanical system. Many physical implementations of qubits have been proposed and developed over the years with some being more promising than others. Some examples of leading qubits implementations include superconducting circuits, spin qubits, and trapped ions.

It is the job of the quantum controller to generate the precise series of external signals, usually pulses of electromagnetic waves and pulses of base band voltage, to perform the desired logic operations (and thus carry out the desired quantum algorithm). Example implementations of a quantum controller are described in further detail below.

Figure 2:
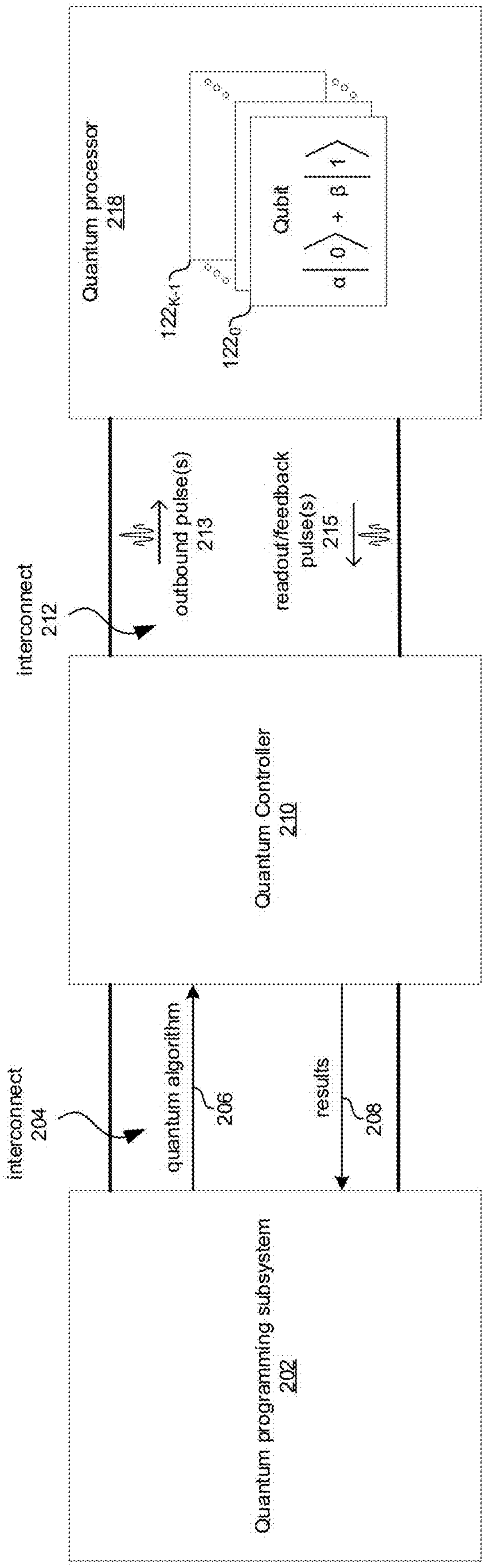
FIG. 2 shows an example quantum computing system.

FIG. 2 shows an example quantum computing system. The system comprises a quantum programming subsystem 202, a quantum controller 210, and a quantum processor 218.

The quantum programming subsystem 202 comprises circuitry operable to generate a quantum algorithm description 206 which the quantum controller 210 can execute to carry out the quantum algorithm on the quantum processor 218 (i.e., generate the necessary outbound quantum pulse(s) 213) with little or no human intervention during runtime of the algorithm. In an example implementation, the quantum programming system 202 is a personal computer having installed on it a quantum controller software development kit (SDK) that enables a user to generate the quantum algorithm description 206 using a programming language. In an example implementation, the programming language may be a low-level language which has little or no abstraction from the instruction set used by the specific hardware of the quantum controller 210. Such instructions may be converted to machine code of the quantum controller 210 without need of a compiler or interpreter. In an example implementation, the programming language may be a high-level language which is much more abstracted from the particular hardware of the quantum controller 210. Such instructions may be compiled into machine code before they can be run on the quantum controller 210. In an example implementation the description 206 may be a machine code description of the quantum algorithm. In an example implementation, the description 206 may be a high-level description which the quantum controller 210 may itself compile into machine code. In an example implementation, the description 206 may be a high-level description which the quantum controller 210 may interpret into machine code during runtime. In an example implementation, an operating system or other software layer may run on the quantum controller 210 and the quantum algorithm description 206 may be software instructions that make use of an application programming interface (API) of the software running on the quantum controller 210.

The quantum programming subsystem 202 is coupled to the quantum controller 210 via interconnect 204 which may, for example, utilize universal serial bus (USB), peripheral component interconnect (PCIe) bus, wired or wireless Ethernet, or any other suitable communication protocol.

The quantum controller 210 comprises circuitry operable to load the quantum algorithm description 206 and then perform the quantum algorithm as per the quantum algorithm description 206. In an example implementation, quantum algorithm description 206 is machine code (i.e., series of binary vectors that represent instructions that the quantum controller's hardware can interpret and execute directly) which is loaded into the quantum controller 210. Then, execution of the machine code by the quantum controller 210 causes the quantum controller 210 to generate the necessary outbound pulse(s) 213 that correspond to the desired operations to be performed on the quantum processor 218 (e.g., sent to qubit(s) for manipulating a state of the qubit(s) or to readout resonator(s) for reading the state of the qubit(s), etc.). Depending on the quantum algorithm to be performed, outbound pulse(s) 213 for carrying out the algorithm may be predetermined at design time and/or may need to be determined during runtime. The runtime determination of the pulses may comprise performance of classical calculations and processing in the quantum controller 210 and/or the quantum programing subsystem 202 during runtime of the algorithm (e.g., runtime analysis of inbound pulses 215 received from the quantum processor 218).

Upon completion of a quantum algorithm and/or during a runtime of a quantum algorithm by the quantum controller 210, the quantum controller 210 may output data/results 298 to the quantum programming subsystem 202. In an example implementation these results may be used to generate a new quantum algorithm description 206 for a subsequent run of the quantum algorithm and/or update the quantum algorithm description during runtime.

The quantum controller 210 is coupled to the quantum processor 218 via interconnect 212 which may comprise, for example, one or more conductors and/or optical fibers.

Figure 3A:
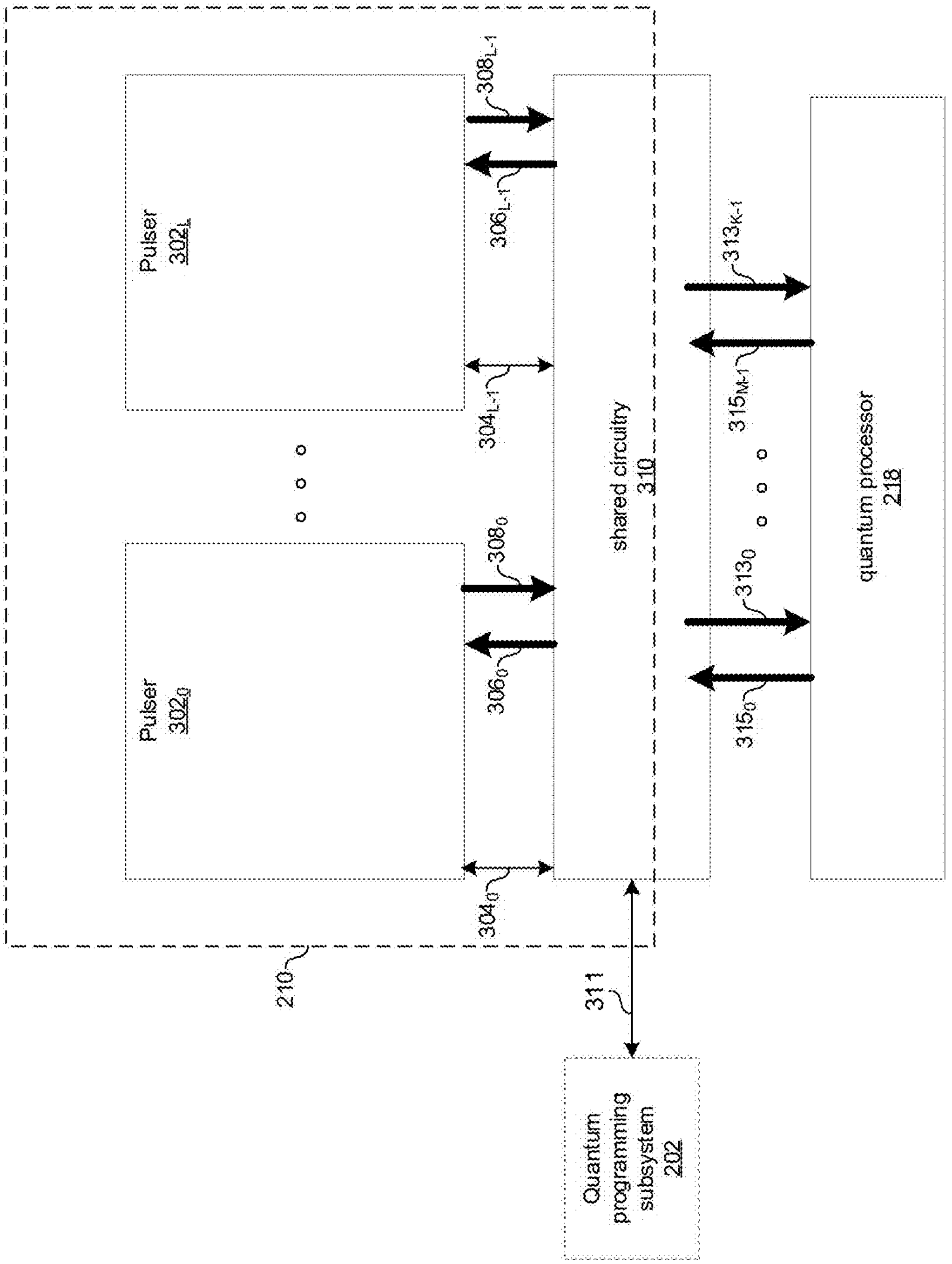
FIG. 3A shows an example quantum controller architecture in accordance with various example implementations of this disclosure.

The quantum processor 218 comprises K (an integer) quantum elements 122, which includes qubits (which could be of any type such as superconducting, spin qubits, ion trapped, etc.), and, where applicable, any other element(s) for processing quantum information, storing quantum information (e.g. storage resonator), and/or coupling the outbound quantum pulses 213 and 215 between interconnect 212 and the quantum element(s) 122 (e.g., readout resonator (s)). In an example implementation in which the quantum processor comprises readout resonators (or other readout circuitry) K may be equal the total number of qubits plus the number of readout circuits. That is, if each of Q (an integer) qubits of the quantum processor 218 is associated with a dedicated readout circuit, then K may be equal to 2Q. For ease of description, the remainder of this disclosure will assume such an implementation, but it need not be the case in all implementations. Other elements of the quantum processor 218 may include, for example, flux lines (electronic lines for carrying current), gate electrodes (electrodes for voltage gating), current/voltage lines, amplifiers, classical logic circuits residing on-chip in the quantum processor 218, and/or the like FIG. 3A shows an example quantum controller architecture in accordance with various example implementations of this disclosure. The quantum controller 210 comprises L (an integer ≥1) pulser circuits $\mathbf{302}_0$-$\mathbf{302}_{L-1}$ and shared circuitry 310.

In the example implementation shown, each pulser circuit $\mathbf{302}_I$ (I an integer between 0 and L−1) comprises circuitry for exchanging information over signal paths $\mathbf{304}_I$, $\mathbf{306}_I$, and $\mathbf{308}_I$, where the signal path $\mathbf{308}_I$ carries outbound pulses (e.g., 213 of FIG. 2) generated by the pulser circuit $\mathbf{302}_I$ (which may be control pulses sent to the quantum processor 128 to manipulate a state of one or more qubits and/or readout pulses to readout a state of one or more qubits), the signal path $\mathbf{306}_I$ carries inbound quantum element readout pulses (e.g., 215 of FIG. 2) to be processed by the pulser circuit $\mathbf{302}_1$, and signal path $\mathbf{304}_I$ carries control information. Each signal path may comprise one or more conductors, optical channels, and/or wireless channels.

Each pulser circuit $302_I$ comprises circuitry operable to generate outbound pulses on signal path $308_I$ according to quantum control operations to be performed on the quantum processor 218. This involves very precisely controlling characteristics such as phase, frequency, amplitude, and timing of the outbound pulses. The characteristics of an outbound pulse generated at any particular time may be determined, at least in part, on inbound pulses received from the quantum processor 218 (via shared circuitry 310 and signal path $306_I$) at a prior time. In an example implementation, the time required to close the feedback loop (i.e., time from receiving a first pulse on one or more of paths $315_I$-$315_L$ (e.g., at an analog to digital converter of the path) to sending a second pulse on one or more of paths $313_0$-$313_{L-1}$ (e.g., at an output of a digital-to-analog converter of the path), where the second pulse is based on the first pulse) is significantly less than the coherence time of the qubits of the quantum processor 218. For example, the time to close the feedback loop may be on the order of 100 nanoseconds. It should be noted that each signal path in FIG. 3A may in practice be a pair of signal paths for supporting generation of phase-quadrature ("I" and "Q") pulse pairs.

In the example implementation shown, the shared circuitry 310 comprises circuitry for exchanging information with the pulser circuits $302_0$-$302_{L-1}$ over signal paths $304_0$-$304_{L-1}$, $306_0$-$306_{L-1}$, and $308_0$-$308_{L-1}$, where each signal path $308_I$ carries outbound pulses generated by the pulser circuit $302_I$, each signal path $306_I$ carries inbound pulses to be processed by pulser circuit $302_I$, and each signal path $304_I$ carries control information such as flag/status signals, data read from memory, data to be stored in memory, data streamed to/from the quantum programming subsystem 202, and data to be exchanged between two or more pulsers $302_0$-$302_L$. Similarly, in the example shown the shared circuitry 310 comprises circuitry for exchanging information with the quantum processor 218 over signal paths $315_0$-$315_{M-1}$ and $313_1$-$313_{K-1}$, where each signal path $315_m$ (m an integer between 0 and M−1) carries inbound pulses from the quantum processor 218, and each signal path $313_k$ (k an integer between 0 and K−1) carries outbound pulses to the quantum processor 218. Additionally, in the example shown the shared circuitry 310 comprises circuitry for exchanging information with the quantum programming subsystem over signal path 311. The shared circuitry 310 may be: integrated with the quantum controller (e.g., on the same field programmable gate array or application specific integrated circuitry or printed circuit board); external to the quantum controller (e.g., on a separate FPGA, ASIC, or PCB connected to the quantum controller via one or more cables, backplanes, in other devices connected to the quantum processor 218, etc.); or partially integrated with the quantum controller and partially external to the quantum controller.

In various implementations, M may be less than, equal to, or greater than L, K may be less than, equal to, or greater than L, and M may be less than, equal to, or greater than K. For example, the nature of some quantum algorithms is such that not all K quantum elements need to be driven at the same time. For such algorithms, L may be less than K and one or more of the L pulsers $302_I$ may be shared among multiple of the K quantum elements circuits. That is, any pulser 302 may generate pulses for different quantum elements at different times. This ability of a pulser $302_I$ to generate pulses for different quantum elements at different times can reduce the required number of pulsers $302_0$-$302_{L-1}$ (i.e., reduce L) required to support a given number of quantum elements (thus saving significant resources, cost, size, overhead when scaling to larger numbers of qubits, etc.).

The ability of a pulser $302_I$ to generate pulses for different quantum elements at different times also enables reduced latency. As just one example, assume a quantum algorithm which needs to send a pulse to quantum element $122_0$ at time T1, but whether the pulse is to be of a first type or second type (e.g., either an X pulse or a Hadamard pulse) cannot be determined until after processing an inbound readout pulse at time T1-DT (i.e., DT time intervals before the pulse is to be output). If there were a fixed assignment of pulsers $302_0$-$302_{L-1}$ to quantum elements of the quantum processor 218 (i.e., if $302_0$ could only send pulses to quantum element $122_0$, and $302_1$ could only send pulses to quantum element $122_1$, and so on), then pulser $302_0$ might not be able to start generating the pulse until it determined what the type was to be. In the depicted example implementation, on the other hand, pulser $302_0$ can start generating the first type pulse and pulser $302_1$ can start generating the second type pulse and then either of the two pulses can be released as soon as the necessary type is determined. Thus, if the time to generate the pulse is That, in this example the example quantum controller 210 may reduce latency of outputting the pulse by $T_{lat}$.

The shared circuitry 310 is thus operable to receive pulses via any one or more of the signals paths $308_0$-$308_{L-1}$ and/or $315_0$-$315_{M-1}$, process the received pulses as necessary for carrying out a quantum algorithm, and then output the resulting processed pulses via any one or more of the signal paths $306_0$-$306_{L-1}$ and/or $313_0$-$313_{K-1}$. The processing of the pulses may take place in the digital domain and/or the analog domain. The processing may comprise, for example: frequency translation/modulation, phase translation/modulation, frequency and/or time division multiplexing, time and/or frequency division demultiplexing, amplification, attenuation, filtering in the frequency domain and/or time domain, time-to-frequency-domain or frequency-to-time-domain conversion, upsampling, downsampling, and/or any other signal processing operation. At any given time, the decision as to from which signal path(s) to receive one or more pulse(s), and the decision as to onto which signal path(s) to output the pulse(s) may be: predetermined (at least in part) in the quantum algorithm description; and/or dynamically determined (at least in part) during runtime of the quantum algorithm based on classical programs/computations performed during runtime, which may involve processing of inbound pulses. As an example of predetermined pulse generation and routing, a quantum algorithm description may simply specify that a particular pulse with predetermined characteristics is to be sent to signal path $313_1$ at a predetermined time. As an example of dynamic pulse determination and routing, a quantum algorithm description may specify that a readout pulse at time T-DT should be analyzed and its characteristics (e.g., phase, frequency, and/or amplitude) used to determine whether at time T pulser $302_I$ should output a pulse to a first quantum element or to a second quantum element. In various implementations of the quantum controller 210, the shared circuitry 310 may perform various other functions instead of and/or in addition to those described above. In general, the shared circuitry 310 may perform functions that are desired to be performed outside of the individual pulser circuits $302_0$-$302_{L-1}$. For example, a function may be desirable to implement in the shared circuitry 310 where the same function is needed by a number of pulser circuits from $302_0$-$302_{1-1}$ and thus may be shared among these pulser circuits instead of redundantly being implemented inside each pulser circuit. As another example, a function may be desirable to implement in the shared circuitry 310 where the function is not needed by all pulser circuits 302$_0$-302$_{L-1}$ at the same time and/or on the same frequency and thus fewer than L circuits for implementing the function may be shared among the L pulser circuits 302$_0$-302$_{L-1}$ through time and/or frequency division multiplexing. As another example, a function may be desirable to implement in the shared circuitry 310 where the function involves making decisions based on inputs, outputs, and/or state of multiple of the L pulser circuits 302$_0$-302$_{L-1}$, or other circuits. Utilizing a centralized coordinator/decision maker in the shared circuitry 310 may have the benefit(s) of: (1) reducing pinout and complexity of the pulser circuits 302$_0$-302$_{L-1}$; and/or (2) reducing decision-making latency. Nevertheless, in some implementations, decisions affecting multiple pulser circuits 302$_0$-302$_{L-1}$ may be made by one or more of the pulser circuits 302$_0$-302$_{L-1}$ where the information necessary for making the decision can be communicated among pulser circuits within a suitable time frame (e.g., still allowing the feedback loop to be closed within the qubit coherence time) over a tolerable number of pins/traces.

Figure 3B:
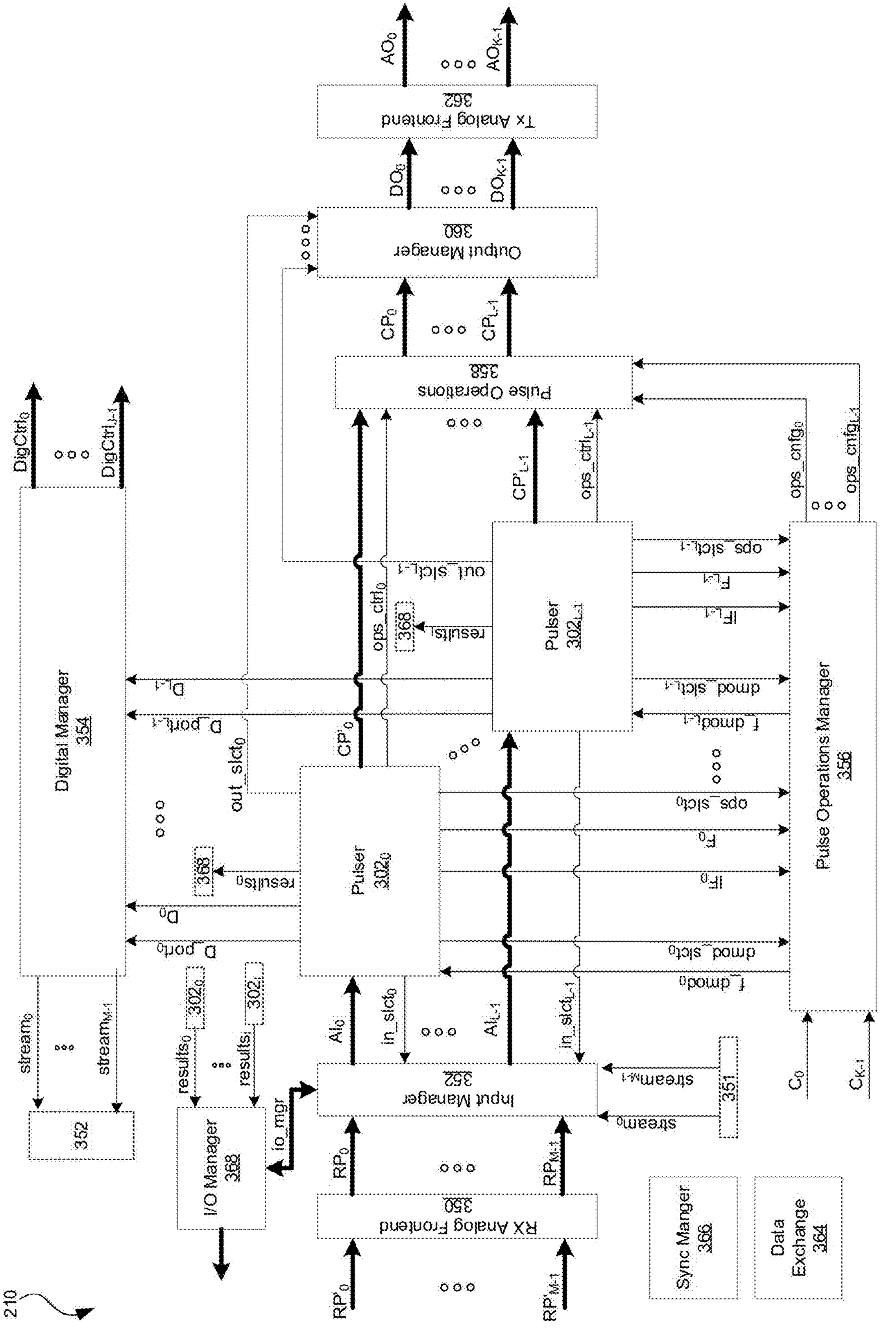
FIG. 3B shows an example implementation of the quantum controller circuitry of FIG. 3A.

FIG. 3B shows an example implementation of the quantum controller of FIG. 2. The example quantum controller shown comprises pulsers 302$_1$-302$_{L-1}$, receive analog frontend 350, input manager 352, digital manager 354, pulse operations manager 356, pulse operations 358, output manager 360, transmit analog frontend 362, data exchange 364, synchronization manager 366, and input/output manager 368. Circuitry depicted in FIG. 3B other than pulser circuits 302$_0$-302$_{L-1}$ corresponds to an example implementation of the shared circuitry 310 of FIG. 3A.

The receive analog frontend 350 comprises circuitry operable to concurrently process up to M (an integer ≥1) analog inbound signals (RP'$_0$-RP'$_{M-1}$) received via signal paths 315$_0$-315$_{M-1}$ to generate up to M concurrent inbound signals (RP$_0$-RP$_{M-1}$) to be output to input manager 352 via one or more signal paths. Although there is shown to be M signals RP and M signals RP', this need not be the case. Such processing may comprise, for example, analog-to-digital conversion, filtering, upconversion, downconversion, amplification, attenuation, time division multiplexing/demultiplexing, frequency division multiplexing/demultiplexing, and/or the like. In various implementations, M may be less than, equal to, or greater than L and M may be less than, equal to, or greater than K.

The input manager 352 comprises circuitry operable to route any one or more of signals (RP$_0$-RP$_{M-1}$) to any one or more of pulsers 302$_0$-302$_{L-1}$ (as signal(s) AI$_0$-AI$_{L-1}$) and/or to other circuits (e.g. as signal io_mgr to I/O manager 368). In an example implementation, the input manager 352 comprises one or more switch networks, multiplexers, and/or the like for dynamically reconfiguring which signals RP$_0$-RP$_{M-1}$ are routed to which pulsers 302$_0$-302$_{L-1}$. This may enable time division multiplexing multiple of the signals RP$_0$-RP$_{M-1}$ onto a single signal AI$_I$ and/or time division demultiplexing components (e.g., time slices) of a signal RP$_m$ onto multiple of the signals AI$_0$-AI$_{L-1}$. In an example implementation, the input manager 352 comprises one or more mixers and/or filters for frequency division multiplexing multiple of the signals RP$_0$-RP$_{M-1}$ onto a single signal AI$_I$ and/or frequency division demultiplexing components (e.g., frequency bands) of a signal RP$_m$ onto multiple of the signals AI$_0$-AI$_{L-1}$. The signal routing and multiplexing/demultiplexing functions performed by the input manager 352 enables: a particular pulser 302$_I$ to process different inbound pulses from different quantum elements at different times; a particular pulser 302$_I$ to process different inbound pulses from different quantum elements at the same time; and multiple of the pulsers 302$_0$-302$_{L-1}$ to processes the same inbound pulse at the same time. In the example implementation shown, routing of the signals RP$_0$-RP$_{M-1}$ among the inputs of the pulsers 302$_0$-302$_{L-1}$ is controlled by digital control signals in_slot$_0$-in_slot$_{L-1}$ from the pulsers 302$_0$-302$_{L-1}$. In another implementation, the input manager may be operable to autonomously determine the appropriate routing (e.g., where the quantum algorithm description includes instructions to be loaded into memory of, and executed by, the input manager 352). In the example implementation, the input manager 352 is operable to rout input signals RP$_0$-RP$_{M-1}$ to the I/O manager 368 (as signal(s) io_mgr), to be sent to the quantum programing subsystem 202. This routing may, for example, be controlled by signals from the digital manager 352. In an example implementation, for each input signal RP$_m$ there is a digital signal, stream$_m$, from the digital manager 354 to the input manager 352 that controls whether RP$_m$ will be sent from the input manager 352 to the I/O manager 368 and from there to the quantum programing subsystem 202.

Each of the pulsers 302$_0$-302$_{L-1}$ is as described above with reference to FIG. 3A. In the example implementation shown, each pulsers 302$_I$ is operable to generate raw outbound pulses CP', ("raw" is used simply to denote that the pulse has not yet been processed by pulse operations circuitry 358) and digital control signals in_slct$_i$, D_port$_i$, D$_I$, out_slct$_I$, ops_ctrl$_I$, ops_slct$_I$, IF$_I$, F$_I$, and dmod_sct$_I$, for carrying out quantum algorithms on the quantum processor 218, and results$_I$ for carrying intermediate and/or final results generated by the pulser 302$_I$ to the quantum programming subsystem 202. One or more of the pulsers 302$_0$-302$_{L-1}$ may receive and/or generate additional signals which are not shown in FIG. 3A for clarity of illustration. The raw outbound pulses CP'$_0$-CP'$_{L-1}$ are conveyed via signal paths 308$_0$-308$_{L-1}$ and the digital control signals are conveyed via signal paths 304$_0$-304$_{L-1}$. Each of the pulsers 302$_I$ is operable to receive inbound pulse signal AI$_I$ and signal f_dmod$_I$. Pulser 302$_I$, may process the inbound signal AI$_I$ to determine the state of certain quantum element(s) in the quantum processor 218 and use this state information for making decisions such as, for example, which raw outbound pulse CP'$_I$ to generate next, when to generate it and what control signals to generate to affect the characteristics of that raw outbound pulse appropriately. Pulser 302$_I$ may use the signal f_dmod$_I$ for determining how to process inbound pulse signal AI$_I$. As an example, when Pulse generator 302$_1$ needs to process an inbound signal AI$_1$ from quantum element 122$_3$, it can send a dmod_sclt$_1$ signal that directs pulse operations manager 356 to send, on f_dmod$_1$, settings to be used for demodulation of an inbound signal AI$_1$ from quantum element 122$_3$ (e.g., the pulse operations manager 356 may send the value $\cos(\omega_3 * \text{time\_stamp} + \phi_3)$, where $\omega_3$ is the frequency of quantum element 122$_3$, time_stamp is amount of time passed since the reference point, for instance the time at which quantum algorithm started running, and $\phi_3$ is the phase of the total frame rotation of quantum element 122$_3$, i.e. the accumulated phase of all frame rotations since the reference point).

The pulse operations circuitry 358 is operable to process the raw outbound pulses CP'$_0$-CP'$_{L-1}$ to generate corresponding output outbound pulses CP$_0$-CP$_{L-1}$. This may comprise, for example, manipulating the amplitude, phase, and/or frequency of the raw pulse CP'$_I$. The pulse operations circuitry 358 receives raw outbound pulses CP'$_0$-CP'$_{L-1}$ from pulsers $302_0$-$302_{L-1}$, control signals ops_cnfg$_0$-ops_cnfg$_{L-1}$ from pulse operations manager 356, and ops_ctrl$_0$-ops_ctrl$_{L-1}$ from pulsers $302_0$-$302_{L-1}$.

The control signal ops_cnfg$_I$ configures, at least in part, the pulse operations circuitry 358 such that each raw outbound pulse CP', that passes through the pulse operations circuitry 358 has performed on it one or more operation(s) tailored for that particular pulse. To illustrate, denoting a raw outbound pulse from pulser 3023 at time T1 as $CP'_{3,T1}$, then, at time T1 (or sometime before T1 to allow for latency, circuit setup, etc.), the digital control signal ops_cnfg$_3$ (denoted ops_cnfg$_{3,T1}$ for purposes of this example) provides the information (e.g., in the form of one or more matrix, as described below) as to what specific operations are to be performed on pulse $CP'_{3,T1}$. Similarly, ops_cnfg$_{4,T1}$ provides the information as to what specific operations are to be performed on pulse $CP'_{4,T1}$, and ops_cnfg$_{3,T2}$ provides the information as to what specific operations are to be performed on pulse $CP'_{4,T1}$.

The control signal ops_ctrl$_I$ provides another way for the pulser $302_I$ to configure how any particular pulse is processed in the pulse operations circuitry 358. This may enable the pulser $302_I$ to, for example, provide information to the pulse operation circuitry 358 that does not need to pass through the pulse operation manager 356. For example, the pulser $302_I$ may send matrix values calculated in real-time by the pulser $302_I$ to be used by the pulse operation circuitry 358 to modify pulse $CP'_I$. These matrix values arrive to the pulse operation circuitry 358 directly from the pulser $302_I$ and do not need to be sent to the pulse operation manager first. Another example maybe that the pulser $302_I$ provides information to the pulse operation circuitry 358 to affect the operations themselves (e.g. the signal ops_ctrl$_I$ can choose among several different mathematical operations that can be performed on the pulse).

The pulse operations manager 356 comprises circuitry operable to configure the pulse operations circuitry 358 such that the pulse operations applied to each raw outbound pulse CP', are tailored to that particular raw outbound pulse. To illustrate, denoting a first raw outbound pulse to be output during a first time interval T1 as $CP'_{I,T1}$, and a second raw outbound pulse to be output during a second time interval T2 as $CP'_{I,T2}$, then pulse operations circuitry 358 is operable to perform a first one or more operations on $CP'_{I,T1}$ and a second one or more operations on $CP'_{1,T2}$. The first one or more operations may be determined, at least in part, based on to which quantum element the pulse $CP_{1,T1}$ is to be sent, and the second one or more operations may be determined, at least in part, based on to which quantum element the pulse $CP_{1,T2}$ is to be sent. The determination of the first one or more operations and second one or more operations may be determined dynamically during runtime.

The transmit analog frontend 362 comprises circuitry operable to concurrently process up to K digital signals DOK to generate up to K concurrent analog signals $AO_k$ to be output to the quantum processor 218. Such processing may comprise, for example, digital-to-analog conversion, filtering, upconversion, downconversion, amplification, attenuation, time division multiplexing/demultiplexing, frequency division multiplexing/demultiplexing and/or the like. In an example implementation, each of the one or more of signal paths $313_0$-$313_{K-1}$ (FIG. 3A) represents a respective portion of Tx analog frontend circuit 362 as well as a respective portion of interconnect 212 (FIG. 2) between the Tx analog frontend circuit 362 and the quantum processor 218. Although there is one-to-one correspondence between the number of DO signals and the number of AO signals in the example implementation described here, such does not need to be the case. In another example implementation, the analog frontend 362 is operable to map more (or fewer) signals DO to fewer (or more) signals AO.

The output manager 360 comprises circuitry operable to route any one or more of signals $CP_0$-$CP_{L-1}$ to any one or more of signal paths $313_0$-$313_{K-1}$. As just one possible example, signal path $313_0$ may comprise a first path through the analog frontend 362 (e.g., a first mixer and DAC) that outputs $AO_0$ and traces/wires of interconnect 212 that carry signal $AO_0$; signal path $313_1$ may comprise a second path through the analog frontend 362 (e.g., a second mixer and DAC) that outputs $AO_1$ and traces/wires of interconnect 212 that carry signal $AO_1$, and so on. In an example implementation, the output manager 360 comprises one or more switch networks, multiplexers, and/or the like for dynamically reconfiguring which one or more signals $CP_0$-$CP_{L-1}$ are routed to which signal paths $313_0$-$313_{K-1}$. This may enable time division multiplexing multiple of the signals $CP_0$-$CP_{L-1}$ onto a single signal path 313*k* and/or time division demultiplexing components (e.g., time slices) of a signal $CP_m$ onto multiple of the signal paths $313_0$-$313_{K-1}$. In an example implementation, the output manager 360 comprises one or more mixers and/or filters for frequency division multiplexing multiple of the signals $CP_0$-$CP_{M-1}$ onto a single signal path 313*k* and/or frequency division demultiplexing components (e.g., frequency bands) of a signal $CP_m$ onto multiple of the signal paths $313_0$-$313_{K-1}$. The signal routing and multiplexing/demultiplexing functions performed by the output manager 360 enables: routing outbound pulses from a particular pulser $302_I$ to different ones of the signal paths $313_0$-$313_{K-1}$ at different times; routing outbound pulses from a particular pulser $302_I$ to multiple of the signal paths $313_0$-$313_{K-1}$ at the same time; and multiple of the pulsers $302_0$-$302_{L-1}$ generating pulses for the same signal path 313*k* at the same time. In the example implementation shown, routing of the signals $CP_0$-$CP_{L-1}$ among the signal paths $313_0$-$313_{K-1}$ is controlled by digital control signals out_slct$_0$-out_slct$_{L-1}$ from the pulsers $302_0$-$302_{L-1}$. In another implementation, the output manager 360 may be operable to autonomously determine the appropriate routing (e.g., where the quantum algorithm description includes instructions to be loaded into memory of, and executed by, the output manager 362).

The digital manager 354 comprises circuitry operable to process and/or route digital control signals (DigCtrl$_0$-DigCtrl$_{J-1}$) to various circuits of the quantum controller 210 and/or external circuits coupled to the quantum controller 210. In the example implementation shown, the digital manager receives, from each pulser $302_1$, (e.g., via one or more of signal paths $304_0$-$304_{N-1}$) a digital signal $D_I$ that is to be processed and routed by the digital manager 354, and a control signal D_port$_I$ that indicates to which output port(s) of the digital manager 354 the signal $D_I$ should be routed. The digital control signals may be routed to, for example, any one or more of circuits shown in FIG. 3B, switches/gates which connect and disconnect the outputs $AO_0$-$AO_{K-1}$ from the quantum processor 218, external circuits coupled to the quantum controller 210 such as microwave mixers and amplifiers, and/or any other circuitry which can benefit from on real-time information from the pulser circuits $302_0$-$302_{L-1}$. Each such destination of the digital signals may require different operations to be performed on the digital signal (such as delay, broadening, or digital convolution with a given digital pattern). These operations may be performed by the digital manager 354 and may be specified by control signals from the pulsers $302_0$-$302_{L-1}$. This allows each pulser $302_I$ to generate digital signals to different destinations and allows different ones of pulse generators $302_0$-$302_{L-1}$ to generate digital signals to the same destination while saving resources.

The synchronization manager 366 comprises circuitry operable to manage synchronization of the various circuits shown in FIG. 3B. Such synchronization is advantageous in a modular and dynamic system, such as quantum controller 210, where different ones of pulsers $302_0$-$302_{L-1}$ generate, receive, and process pulses to and from different quantum elements at different times. For example, while carrying out a quantum algorithm, a first pulser circuit $302_1$ and a second pulser circuit $302_2$ may sometimes need to transmit pulses at precisely the same time and at other times transmit pulses independently of one another. In the example implementation shown, the synchronization manager 366 reduces the overhead involved in performing such synchronization.

The data exchange circuitry 364 is operable to manage exchange of data among the various circuits shown in FIG. 3B. For example, while carrying out a quantum algorithm, first pulser circuit $302_1$ and a second pulser circuit $302_2$ may sometimes need to exchange information. As just one example, pulser $302_1$ may need to share, with pulser $302_2$, the characteristics of an inbound signal $AI_1$ that it just processed so that pulser $302_2$ can generate a raw outbound pulse $CP'_2$ based on the characteristics of $AI_1$. The data exchange circuitry 364 may enable such information exchange. In an example implementation, the data exchange circuitry 364 may comprise one or more registers to and from which the pulsers $302_0$-$302_{L-1}$ can read and write.

The I/O manager 368 is operable to route information between the quantum controller 210 and the quantum programming subsystem 202.

Figure 4:
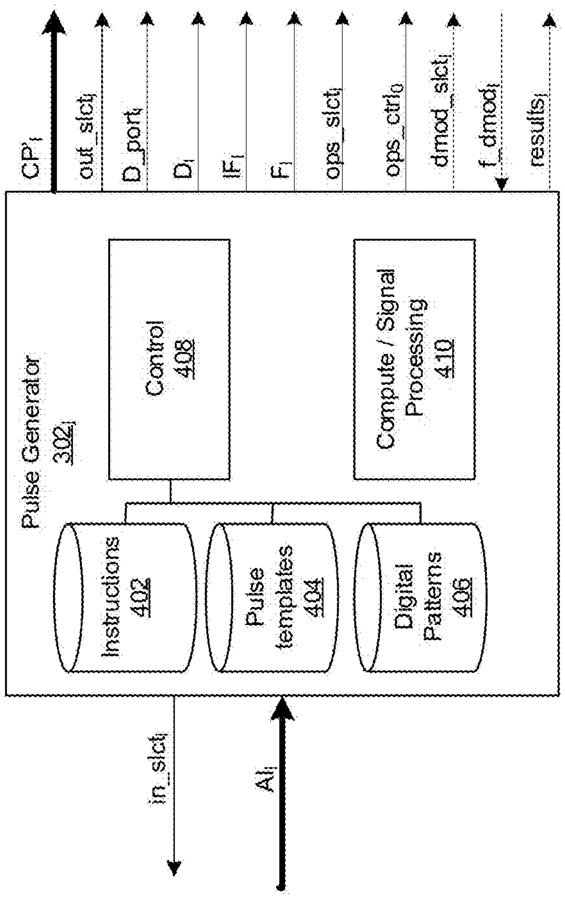
FIG. 4 shows an example implementation of the pulser of FIG. 3B.

FIG. 4 shows an example implementation of the raw pulser of FIG. 3B. The example pulser $302_I$ shown comprises instruction memory 402, pulse template memory 404, digital pattern memory 406, control circuitry 408, and compute and/or signal processing circuitry (CSP) 410.

The memories 402, 404, 406 may comprise one or more be any type of suitable storage elements (e.g., DRAM, SRAM, Flash, etc.). The instructions stored in memory 402 are instructions to be executed out by the pulser $302_I$ for carrying out its role in a quantum algorithm. Because different pulsers $302_0$-$302_{L-1}$ have different roles to play in any particular quantum algorithm (e.g., generating different pulses at different times), the instructions memory 402 for each pulser $302_I$ may be specific to that pulser. For example, the quantum algorithm description 206 from the quantum programming subsystem 202 may comprise a first set of instructions to be loaded (via I/O manager 368) into pulser $302_0$, a second set of instructions to be loaded into pulser $302_1$, and so on. Each pulse template stored in memory 404 comprises a sequence of one or more samples of any arbitrary shape (e.g., Gaussian, sinc, impulse, etc.) representing the pulses to be sent to pulse operation circuitry 358. Each digital pattern stored in memory 406 comprises a sequence of one or more binary values which may represent the digital pulses to be sent to the digital manager 354 for generating digital control signals $DigCtrl_0$-$DigCtrl_{J-1}$.

The control circuitry 408 is operable to execute the instructions stored in memory 402 to process inbound signal $AI_I$, generate raw outbound pulses $CP'_I$, and generate digital control signals $in\_slct_I$, $out\_slct_I$, $D\_port_I$, $D_I$, $IF_I$, $F_I$, $ops\_slct_I$, $ops\_ctrl_I$, $results_I$, and $dmod\_slct_I$. In the example implementation shown, the processing of the inbound signal $AI_I$ is performed by the CSP circuitry 410 and based (at least in part) on the signal $f\_dmod_I$.

The compute and/or signal processing circuitry (CSP) 410 is operable to perform computational and/or signal processing functions, which may comprise, for example Boolean-algebra based logic and arithmetic functions and demodulation (e.g., of inbound signals $AI_I$).

In operation of an example implementation, generation of a raw outbound pulse $CP'_I$ comprises the control circuitry 408: (1) determining a pulse template to retrieve from memory 404 (e.g., based on a result of computations and/or signal processing performed by the CSP 410); (2) retrieving the pulse template; (3) performing some preliminary processing on the pulse template; (4) determining the values of F, IF, $ops\_slct_I$, and $dmod\_slct_I$ to be sent to the pulse operation manager 356 (as predetermined in the quantum algorithm description and/or determined dynamically based on results of computations and/or signal processing performed by the CSP 410); (5) determining the value of $ops\_ctrl_I$ to be sent to the pulse operation circuitry 358; (6) determining the value of $in\_slct_I$ to be sent to the input manager 352; (7) determining a digital pattern to retrieve from memory 406 (as predetermined in the quantum algorithm description and/or determined dynamically based on results of computations and/or signal processing performed by the CSP 410); (8) outputting the digital pattern as $D_I$ to the digital manager along with control signal $D\_port_I$ (as predetermined in the quantum algorithm description and/or determined dynamically based on results of computations and/or signal processing performed by the CSP 410); (9) outputting the raw outbound pulse $CP'_I$ to the pulse operations circuitry 358; (10) outputting $results_I$ to the I/O manager.

Figure 5:
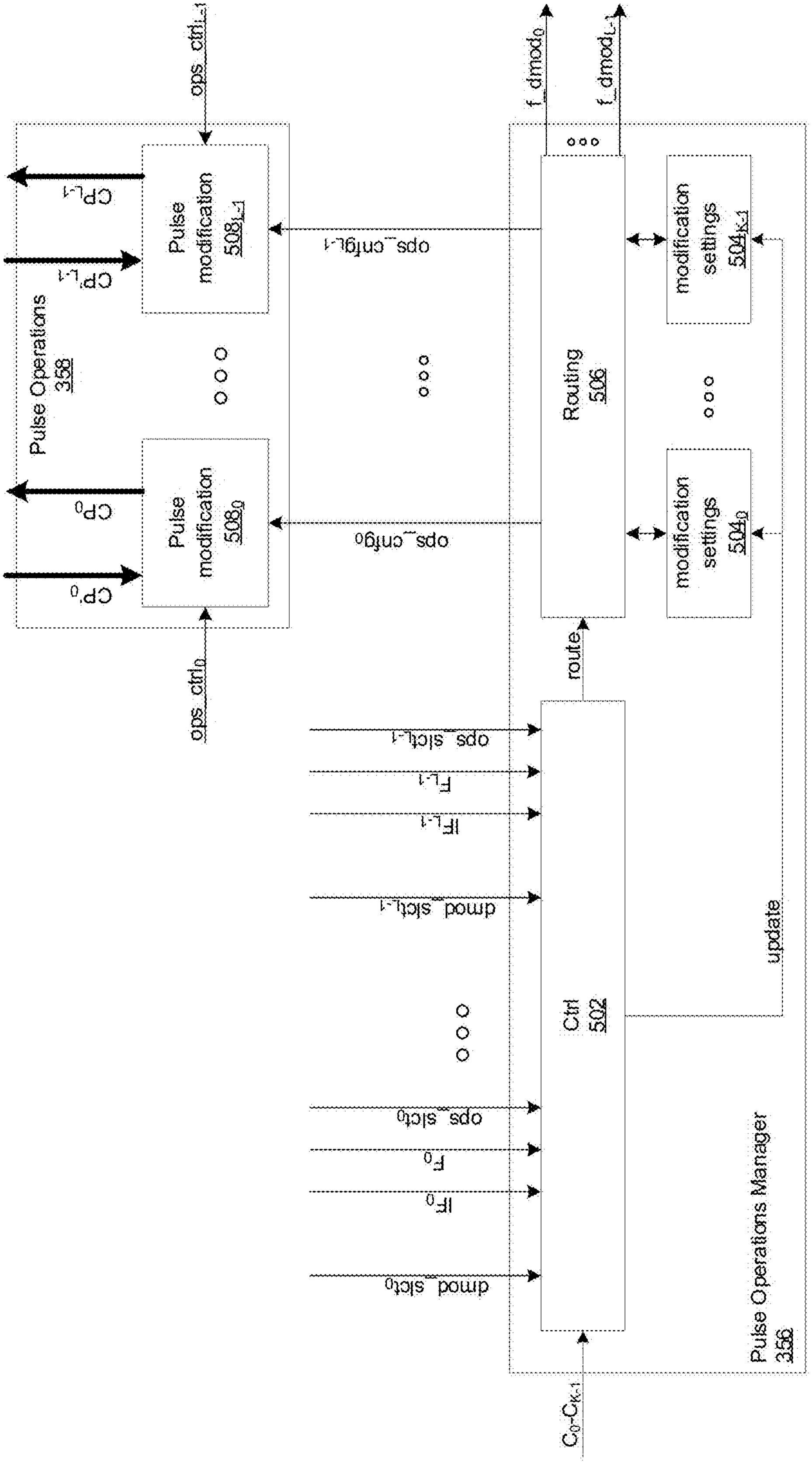
FIG. 5 shows an example implementation of the pulse operations manager and pulse operations circuitry of FIG. 3B

FIG. 5 shows an example implementation of the pulse operations manager and pulse operations circuitry of FIG. 3B. The pulse operations circuitry 358 comprises a plurality of pulse modification circuits $508_0$-$508_{L-1}$. The pulse operations manager 356 comprises control circuitry 502, routing circuitry 506, and a plurality of modification settings circuits $504_0$-$504_{K-1}$.

Although the example implementation has a 1-to-1 correspondence between pulse modification circuits $508_0$-$508_{L-1}$ and pulser circuits $302_0$-$302_{L-1}$ (i.e., there are L of each), that does not need to be the case. In other implementations there may be fewer pulse modification circuits 508 than pulser circuits 302. Similarly, other implementations may comprise more pulse modification circuits 508 than pulser circuits 302.

Each pulse modification circuit $508_I$ is operable to process raw outbound pulses $CP'_I$ according to $ops\_cnfg_I$ and $ops\_ctrl_I$ to output outbound pulses $CP_I$. Such processing may comprise adjusting a phase, frequency, and/or amplitude of the raw outbound pulses $CP_I$. In an example implementation, $ops\_cnfg_I$ is in the form of elements of one or more matrices of complex numbers and the processing comprises multiplying a matrix representation of the raw outbound pulses $CP_I$ with the matrix/matrices of $ops\_cnfg_I$, as described below.

As an example, in some instances two of the pulsers $302_0$-$302_{L-1}$ may generate two raw outbound pulses which are a phase-quadrature pulse pair. For example, assuming $CP'_1$ and $CP'_2$ are a phase-quadrature pulse pair to be output on path $313_3$. In this example, pulse operations circuitry 358 may process $CP_1$ and $CP_2$ by multiplying a vector representation of $CP'_1$ and $CP'_2$ by one or more 2 by 2 matrices to: (1) perform single-sideband-modulation, as given by $$\begin{pmatrix} CP_1 \\ CP_2 \end{pmatrix} = \begin{pmatrix} \cos(\omega * \text{time\_stamp}) & -\sin(\omega * \text{time\_stamp}) \\ \sin(\omega * \text{time\_stamp}) & \cos(\omega * \text{time\_stamp}) \end{pmatrix} \begin{pmatrix} CP'_1 \\ CP'_2 \end{pmatrix},$$

where ω is the frequency of the single side band modulation and time_stamp is the time passed since the reference time (e.g. the beginning of a certain control protocol); (2) keep track of frame-of-reference rotations, as given by $$\begin{pmatrix} CP_1 \\ CP_2 \end{pmatrix} = \begin{pmatrix} \cos(\phi) & -\sin(\phi) \\ \sin(\phi) & \cos(\phi) \end{pmatrix} \begin{pmatrix} CP'_1 \\ CP'_2 \end{pmatrix},$$

where ϕ is the total phase that the frame of reference accumulated since the reference time; and/or (3) perform an IQ-mixer correction $$\begin{pmatrix} CP_1 \\ CP_2 \end{pmatrix} = \begin{pmatrix} C_{00} & C_{01} \\ C_{10} & C_{11} \end{pmatrix} \begin{pmatrix} CP'_1 \\ CP'_2 \end{pmatrix},$$

where $C_{00}$, $C_{01}$, $C_{10}$, and $C_{11}$ are the elements of a matrix that corrects for IQ-mixer imperfections. In an example implementation, each modification settings circuit, 504$_k$, contains registers that contain the matrix elements of three matrices:

$$C_k = \begin{pmatrix} C_{k00} & C_{k01} \\ C_{k10} & C_{k11} \end{pmatrix},$$

an IQ-mixer correction matrix;

$$S_k = \begin{pmatrix} \cos(\omega_k * \text{time\_stamp}) & -\sin(\omega_k * \text{time\_stamp}) \\ \sin(\omega_k * \text{time\_stamp}) & \cos(\omega_k * \text{time\_stamp}) \end{pmatrix},$$

a single side band frequency modulation matrix; and $$F_k = \begin{pmatrix} \cos(\phi_k) & -\sin(\phi_k) \\ \sin(\phi_k) & \cos(\phi_k) \end{pmatrix},$$

a frame rotation matrix, which rotates the IQ axes around the axis perpendicular to the IQ plane (i.e. the z-axis if I and Q are the x-axis and y-axis). In an example implementation, each modification parameters circuit 504$_k$ also contains registers that contain the elements of the matrix products $C_K S_k F_k$ and $S_k F_k$.

The control circuitry 502 is operable to exchange information with the pulser circuits 302$_0$-302$_{L-1}$ to generate values of ops_confg$_0$-ops_confg$_{L-1}$ and f_demod$_0$-f_demod$_{L-1}$ by controlling routing circuitry 506 based on signals ops_slct$_0$-ops_slct$_{L-1}$ and dmod_slct$_0$-dmod_slct$_{L-1}$, and by updating pulse modification settings 504$_0$-504$_{K-1}$ based on IF$_0$-IF$_{L-1}$ and F$_0$-F$_{L-1}$ such that pulse modification settings output to pulse operations circuitry 358 are specifically tailored to each raw outbound pulse (e.g., to which quantum element 222 the pulse is destined, to which signal path 313 the pulse is destined, etc.) to be processed by pulse operations circuitry 358.

Each modification settings circuit 504$_k$ comprises circuitry operable to store modification settings for later retrieval and communication to the pulse operations circuitry 358. The modification settings stored in each modification settings circuit 504$_k$ may be in the form of one or more two-dimensional complex-valued matrices. Each signal path 313$_0$-313$_{K-1}$ may have particular characteristics (e.g., non-idealities of interconnect, mixers, switches, attenuators, amplifiers, and/or circuits along the paths) to be accounted for by the pulse modification operations. Similarly, each quantum element 122$_0$-122$_k$ may have a particular characteristics (e.g. resonance frequency, frame of reference, etc.). In an example implementation, the number of pulse modification settings, K, stored in the circuits 504 corresponds to the number of quantum element 122$_0$-122$_{K-1}$ and of signal paths 313$_0$-313$_{K-1}$ such that each of the modification settings circuits 504$_0$-504$_{K-1}$ stores modification settings for a respective one of the quantum elements 122$_0$-122$_{K-1}$ and/or paths 313$_0$-313$_{K-1}$. In other implementations, there may be more or fewer pulse modification circuits 504 than signal paths 313 and more or fewer pulse modification circuits 504 than quantum elements 122 and more or fewer signal paths 313 than quantum elements 122.

The routing circuitry 506 is operable to route modification settings from the modification settings circuits 504$_0$-504$_{L-1}$ to the pulse operations circuit 358 (as ops_confg$_0$-ops_confg$_{L-1}$) and to the pulsers 302$_0$-302$_{L-1}$ (as f_dmod$_0$-f_dmod$_{L-1}$). In the example implementation shown, which of the modification settings circuits 504$_0$-504$_{K-1}$ has its/their contents sent to which of the pulse modification circuits 508$_0$-508$_{L-1}$ and to which of the pulsers 302$_0$-302$_{L-1}$ is controlled by the signals "route" from the control circuitry 502.

The signal ops_slct$_l$ informs the pulse operations manager 356 as to which modification parameters 504$_k$ to send to the pulse modification circuit 508$_l$. The pulser 302$_l$ may determine ops_slct$_l$ based on the particular quantum element 122$_k$ and/or signal path 313$_k$ to which the pulse is to be transmitted (e.g., the resonant frequency of the quantum element, frame of reference, and/or mixer correction). The determination of which quantum element and/or signal path to which a particular pulser 302$_l$ is to send an outbound pulse at a particular time may be predetermined in the quantum algorithm description or may be determined based on calculations performed by the pulser 302$_l$ and/or others of the pulsers 302$_0$-302$_{L-1}$ during runtime. The control circuitry 502 may then use this information to configure the routing block 506 such that the correct modification settings are routed to the correct one of the pulse modification circuits 508$_0$-508$_{L-1}$.

In an example implementation, each ops_cnfg$_k$ signal may comprise two components ops_cnfg$_{k,0}$ and ops_cnfg$_{k,1}$ and the pulse modification circuits 508$_1$ and 508$_2$ may perform the following operation: CP$_1$=ops_cnfg$_{1,0}$*CP'$_1$+ops_cng$_{2,1}$*CP'$_2$ and CP$_2$=ops_cnfg$_{1,1}$*CP'$_1$+ops_cnfg$_{2,0}$*CP'$_2$. To generate CP$_1$ and CP$_2$ as a phase-quadrature pulse pair, ops_slct$_1$ and ops_slct2 may instruct the pulse operations manager 256 to set ops_cnfg$_{1,0}$=CSF$_{k00}$, ops_cnfg$_{1,1}$=CSF$_{k10}$, ops_cnfg$_{2,0}$=CSF$_{k11}$, and ops_cnfg$_{2,1}$=CSF$_{k01}$ such that $$\begin{pmatrix} CP_1 \\ CP_2 \end{pmatrix} = \begin{pmatrix} CSF_{00} & CSF_{01} \\ CSF_{10} & CSF_{11} \end{pmatrix} \begin{pmatrix} CP'_1 \\ CP'_2 \end{pmatrix},$$

where CSF$_{kij}$ is the ij$^{th}$ matrix element of CSF$_k$. To generate CP$_1$ as a single-phase pulse, ops_slct$_1$ may instruct the pulse operations manager 356 to set ops_cnfgs$_{1,0}$=SF$_{s00}$=cos(ω$_k$*time_stamp+ϕ$_k$) and ops_cnfg$_{2,1=0}$, such that CP$_1$=cos(ω$_k$*time_stamp+ϕ$_k$)CP'$_1$. Thus, such an implementation enables each pulse generator $302_l$ to generate pulses to be played as a part of phase-quadrature pulse pairs or as independent single-phase pulses and modify these pulses with any one of the CSF or SF matrices, which are shared among all pulse generators.

In an example implementation, the digital signal $IF_l$ instructs the pulse operations manager 356 to update a frequency setting of the modification settings circuit $504_k$ indicated by ops_slct$_l$. In an example implementation, the frequency setting is the matrix $S_k$ (described above) and the signal $IF_l$ carries new values indicating the new $\omega_k$ to be used in the elements of the matrix $S_k$. The new values may, for example, be determined during a calibration routine (e.g., performed as an initial portion of the quantum algorithm) in which one or more of the pulse generators $302_0$-$302_{L-1}$ sends a series of outbound pulses CP, each at a different carrier frequency, and then measures the corresponding inbound signals AI.

In an example implementation, the signal $F_l$ instructs the pulse operations manager 356 to update a frame setting of the modification settings circuit $504_k$ indicated by ops_slct$_1$. In an example implementation, the frame setting is the matrix $F_k$ (described above) and the signal $F_l$ carries a rotation matrix $F_l$ which multiplies with $F_k$ to rotate $F_k$. This can be written as $$F_k = F_1F_k = \begin{pmatrix} \cos(\Delta\phi) & -\sin(\Delta\phi) \\ \sin(\Delta\phi) & \cos(\Delta\phi) \end{pmatrix}\begin{pmatrix} \cos(\phi_k) & -\sin(\phi_k) \\ \sin(\phi_k) & \cos(\phi_k) \end{pmatrix} = \begin{pmatrix} \cos(\phi_k+\Delta\phi) & -\sin(\phi_k+\Delta\phi) \\ \sin(\phi_k+\Delta\phi) & \cos(\phi_k+\Delta\phi) \end{pmatrix},$$

where $\phi_k$ is the frame of reference before the rotation and $\Delta\phi$ is the amount by which to rotate the frame of reference. The pulser 302 may determine $\Delta\phi$ based on a predetermined algorithm or based on calculations performed by the pulse generator $302_l$ and/or others of the pulse generators $302_0$-$302_{L-1}$ during runtime.

In an example implementation, the signal dmod_sclt$_l$ informs the pulse operations manager 356 from which of the modification settings circuits $504_k$ to retrieve values to be sent to pulser $302_l$ as f_dmod$_l$. The pulser $302_l$ may determine dmod_slct$_l$, based on the particular quantum element $122_k$ and/or signal path $315_k$ from which the pulse to be processed arrived. The determination of from which quantum element and/or signal path a particular pulser $302_l$ is to process an inbound pulse at a particular time may be predetermined in the quantum algorithm description or may be determined based on calculations performed by the pulser $302_l$ and/or others of the pulsers $302_0$-$302_{L-1}$ during runtime. The control circuitry 502 may then use this information to configure the routing block 506 such that the correct modification settings are routed to the correct one of the pulsers $302_0$-$302_{L-1}$. For example, when pulse generation circuit $302_l$ needs to demodulate a pulse signal $AI_l$ from quantum element $122_k$, it will send a dmod_sclt$_l$ signal instructing the pulse operation manager 356 to rout the element $SF_{k00}$=cos ($\omega_k$*time_stamp+$\phi_k$) from modification settings circuit $504_k$ to pulser $302_l$ (as f_dmod$_l$).

In the example implementation shown, the digital signals $C_0$-$C_{K-1}$ provide information about signal-path-specific modification settings to be used for each of the signal paths $313_0$-$313_{K-1}$. For example, each signal $C_k$ may comprise a matrix to be multiplied by a matrix representation of a raw outbound pulse CP'$_l$, such that the resulting output outbound pulse is pre-compensated for errors (e.g., resulting from imperfections in mixers, amplifiers, wiring, etc.) introduced as the outbound pulse propagates along signal path 313*k*. The result of the pre-compensation is that output outbound pulse $CP_l$ will have the proper characteristics upon arriving at the quantum processor 218. The signals $C_0$-$C_{K-1}$ may, for example, be calculated by the quantum controller 210 itself, by the programming subsystem 202, and/or by external calibration equipment and provided via I/O manager 368. The calculation of signals may be done as part of a calibration routine which may be performed before a quantum algorithm and/or may be determined/adapted in real-time as part of a quantum algorithm (e.g., to compensate for temperature changes during the quantum algorithm).

Figure 6:
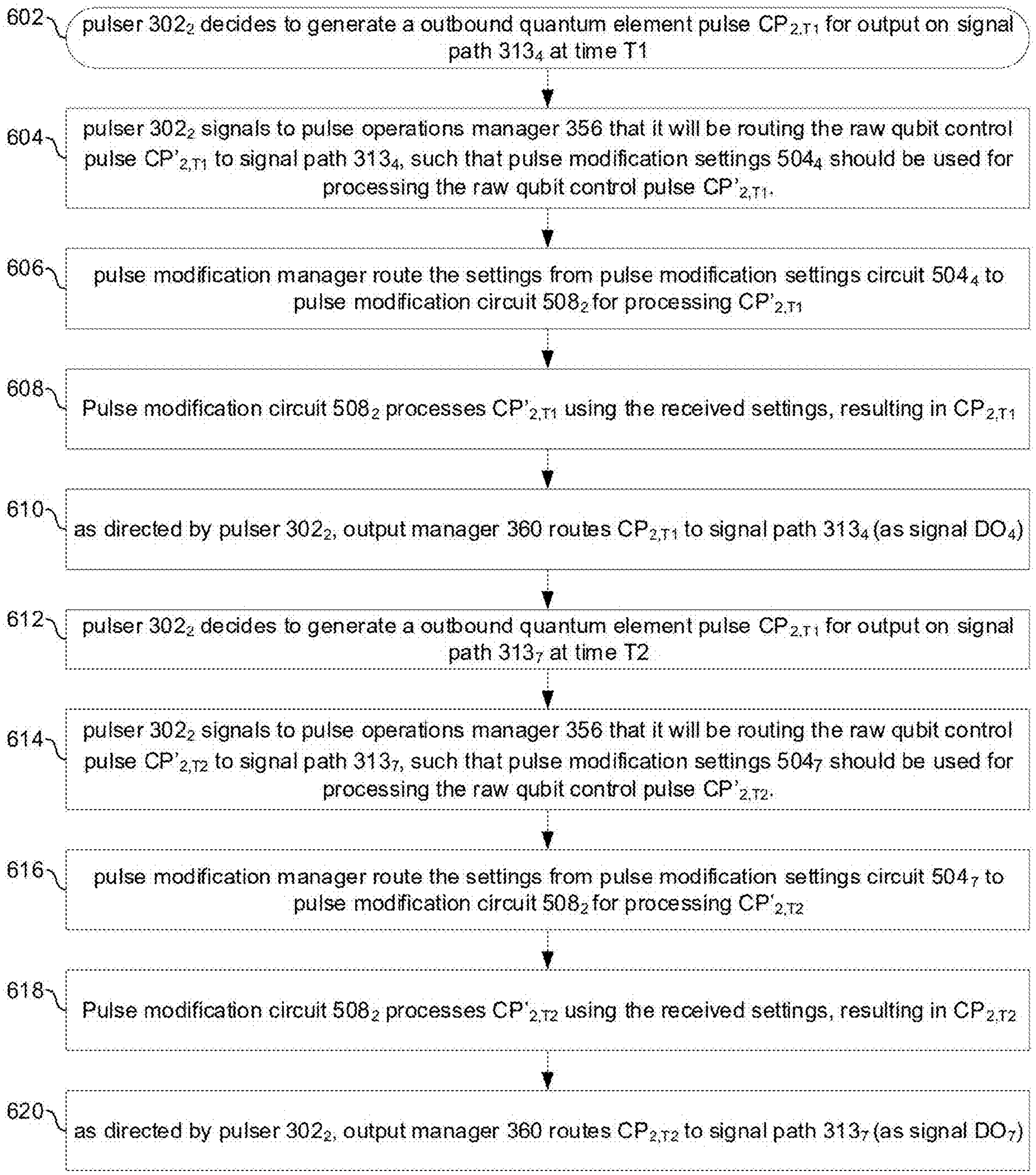
FIG. 6 is a flowchart illustrating an example operation of a quantum controller in accordance with an example implementation of this disclosure.

FIG. 6 is a flowchart illustrating an example operation of a quantum controller in accordance with an example implementation of this disclosure.

The process begins with block 602 in which pulser $302_2$ decides to generate a raw outbound pulse $CP'_{2,T1}$ to be output on signal path $313_4$ at time T1. The decision is based on instructions loaded in memory 402 and may take into account the result of computations performed by the CSP 410 of the pulser $302_2$ and/or CSP 410 of another of the pulsers $302_0$-$302_{L-1}$ (e.g., based on an inbound quantum element readout signal $AI_2$ demodulated by a CSP 410).

In block 604, pulser $302_2$ signals to pulse operations manager 356, via signal ops_slct$_2$, that it wants the raw outbound pulse $CP'_{2,T1}$ to be modified with pulse modification settings stored in $504_4$.

In block 606, pulse modification manager 356 routes the settings from pulse modification settings circuit $504_4$ to pulse modification circuit $508_2$.

In block 608, pulse modification circuit $508_2$ processes $CP'_{2,T1}$ using the settings received in block 606. The result is output outbound quantum pulse $CP_{2,T1}$.

In block 610, as directed by pulser $302_2$, output manager 360 routes $CP_{2,T1}$ to signal path $313_4$ (as signal $DO_4$).

In block 612, pulser $302_2$ decides to generate a raw outbound pulse $CP'_{2,T2}$ to be output on signal path $313_7$ at time T2. The decision is based on instructions loaded in memory 402 and may take into account the result of computations performed by the CSP 410 of the pulser $302_2$ and/or CSP 410 of another of the pulsers $302_0$-$302_{L-1}$ (e.g., based on an inbound quantum element readout signal $AI_2$ demodulated by a CSP 410).

In block 614, pulser $302_2$ signals to pulse operations manager 356, via signal ops_slct$_2$, that it wants to modify raw outbound pulse $CP'_{2,T2}$ with pulse modification settings stored in $504_7$.

In block 616, pulse modification manager 356 routes the settings from pulse modification settings circuit 5047 to pulse modification circuit $508_2$.

In block 618, pulse modification circuit $508_2$ processes $CP'_{2,T2}$ using the settings received in block 616. The result is output outbound quantum pulse $CP_{2,T2}$.

In block 620, as directed by pulser $302_2$, output manager 360 routes $CP_{2,T2}$ to signal path $313_7$ (as signal $DO_7$).

Thus, at different times during runtime of a single quantum algorithm, a single pulser 302 generates pulses for two different paths (which may correspond to two different quantum elements 122 of the quantum processor 202, in this example), and each of the pulses receives different processing that is customized for its respective path and/or quantum element.

In accordance with an example implementation of this disclosure, a quantum controller (e.g., 210) comprises raw pulse generation circuitry (e.g., one or more pulsers 302), pulse modification circuitry (e.g., 356 and 358), and output management circuitry (e.g., 360). The raw pulse generation circuitry (e.g., $\mathbf{302}_1$) is operable to generate a raw pulse (e.g., $CP_{1,T1}$). The output management circuitry is operable to route one or more output pulses (e.g., one or more of $CP_0$-$CP_{L-1}$) onto a selected one or more of a plurality of signal paths (e.g., one or more of $\mathbf{313}_0$-$\mathbf{313}_{K-1}$) based on to which one or more of a plurality of elements of a quantum processor (e.g., quantum elements $\mathbf{122}_0$-$\mathbf{122}_{K-1}$ of quantum processor 218) the one or more output pulses are to be sent. The pulse modification circuitry is operable to select one or more pulse modification settings (e.g., stored in one or more of $\mathbf{504}_0$-$\mathbf{504}_{L-1}$) to use for processing of the raw pulse, where the selection is based on which of the plurality of signal paths are the selected one or more signal paths (e.g., $\mathbf{313}_4$ may be the selected signal path) and/or to which of the one or more of the plurality of elements of the quantum processor the one or more output pulses are to be sent. The pulse modification circuitry is operable to process the raw pulse using the selected one or more pulse modification settings to generate the one or more output pulses. The one or more output pulses may comprise a first output pulse generated via a first of the one or more pulse modification settings and a second output pulse generated via a second of the one or more pulse modification settings. The first of the one or more pulse modification settings may be selected based on a first of the one or more signal paths (e.g., $CP_{1,T1}$ generated using settings from $\mathbf{504}_3$ based on the pulse being intended for $\mathbf{313}_3$), and the second of the one or more pulse modification settings may be selected based on a second of the one or more signal paths to which the second output pulse is to be transmitted (e.g., $CP_{1,T2}$ generated using settings from $\mathbf{504}_4$ based on the pulse being intended for $\mathbf{313}_4$). The first of the one or more pulse modification settings may be selected based on characteristics (e.g., frequency, phase, etc.) of a first of the plurality of elements of the quantum processor (e.g., $CP_{1,T1}$ generated using settings from $\mathbf{504}_3$ based on the pulse being intended for quantum element $\mathbf{122}_3$), and the second of the one or more pulse modification settings may be selected based on characteristics (e.g., frequency, phase, etc.) of a second of the plurality of elements of the quantum processor (e.g., $CP_{1,T2}$ generated using settings from $\mathbf{504}_4$ based on the pulse being intended for $\mathbf{122}_4$). The processing of the raw pulse using the one or pulse modification settings may result in an output pulse at a different carrier frequency than the raw pulse. The processing of the raw pulse using the one or more pulse modification settings may result in a frame of reference of the one or more output pulses being rotated with respect to a frame of reference of the raw pulse. The processing of the raw pulse using the one or more pulse modification settings may adjust a phase, frequency, and/or amplitude of the raw pulse to compensate for errors introduced by the selected one or more signal paths (e.g., in 362). The quantum controller may comprise input management circuitry (e.g., 352) operable to receive quantum element readout pulses (e.g., $RP_0$-$RP_{M-1}$) from a plurality of quantum elements, and route each of the quantum element readout pulses to one or more of a plurality of inputs of the raw pulse generation circuitry (e.g., as one or more of $A_0$-$A_{L-1}$), wherein the one or more inputs are dynamically determined during execution of instructions of a quantum computing algorithm by the quantum controller. The pulse modification circuitry may be operable to store a plurality of pulse modification settings (e.g., in $\mathbf{504}_0$-$\mathbf{504}_{L-1}$). The pulse modification circuitry may be dynamically configurable such that which of the plurality of pulse modifications settings are applied to the raw pulse is selectable during execution of instructions of a quantum computing algorithm by the quantum controller. Each pulse modification setting of the plurality of pulse modification settings may be configured for use with a respective signal path of the plurality of signal paths (e.g., settings in $\mathbf{504}_0$ may be tailored for signal path $\mathbf{313}_0$ and settings in 5041 may be tailored for signal path $\mathbf{313}_1$).

As used herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As used herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}. As used herein, the term "exemplary" means serving as a non-limiting example, instance, or illustration. As used herein, the terms "e.g.," and "for example" set off lists of one or more non-limiting examples, instances, or illustrations. As used herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.). As used herein, the term "based on" means "based at least in part on." For example, "x based on y" means that "x" is based at least in part on "y" (and may also be based on z, for example).

The present method and/or system may be realized in hardware, software, or a combination of hardware and software. The present methods and/or systems may be realized in a centralized fashion in at least one computing system, or in a distributed fashion where different elements are spread across several interconnected computing systems. Any kind of computing system or other apparatus adapted for carrying out the methods described herein is suited. A typical implementation may comprise one or more application specific integrated circuit (ASIC), one or more field programmable gate array (FPGA), and/or one or more processor (e.g., x86, x64, ARM, PIC, and/or any other suitable processor architecture) and associated supporting circuitry (e.g., storage, DRAM, FLASH, bus interface circuits, etc.). Each discrete ASIC, FPGA, Processor, or other circuit may be referred to as "chip," and multiple such circuits may be referred to as a "chipset." Another implementation may comprise a non-transitory machine-readable (e.g., computer readable) medium (e.g., FLASH drive, optical disk, magnetic storage disk, or the like) having stored thereon one or more lines of code that, when executed by a machine, cause the machine to perform processes as described in this disclosure. Another implementation may comprise a non-transitory machine-readable (e.g., computer readable) medium (e.g., FLASH drive, optical disk, magnetic storage disk, or the like) having stored thereon one or more lines of code that, when executed by a machine, cause the machine to be configured (e.g., to load software and/or firmware into its circuits) to operate as a system described in this disclosure.

While the present method and/or system has been described with reference to certain implementations, it will be understood by those skilled in the art that various changes may be made and equivalents may be substituted without departing from the scope of the present method and/or system. In addition, many modifications may be made to adapt a particular situation or material to the teachings of the present disclosure without departing from its scope. Therefore, it is intended that the present method and/or system not be limited to the particular implementations disclosed, but that the present method and/or system will include all implementations falling within the scope of the appended claims.

What is claimed is:

1. A system comprising:

a pulse generation circuit configured to adaptively determine a pulse and a routing signal during an operation of a quantum algorithm; and a management circuit configured to route the pulse to a first quantum element according to the routing signal.

2. The system of claim 1, wherein the management circuitry is configured to route the pulse during a runtime of the quantum algorithm.

3. The system of claim 1, wherein the pulse is adaptively determined according to a characteristic of a readout pulse received from a second quantum element.

4. The system of claim 1, wherein the routing signal is generated according to one or more calculations performed by the pulse generation circuit.

5. The system of claim 1, wherein the pulse generation circuit comprises a raw pulse generation circuit and a pulse modification circuit.

6. The system of claim 5, wherein:

the pulse modification circuit is configured to store a plurality of pulse modification settings, and each of the plurality of pulse modification settings is configured to provide a characteristic to control a controlled element.

7. The system of claim 6, wherein the pulse modification circuit is configured to determine which of the plurality of pulse modification settings to use for processing the pulse.

8. The system of claim 6, wherein each of plurality of pulse modification settings determines a phase, frequency, and/or amplitude of the pulse.

9. The system of claim 1, wherein the route is predetermined by a quantum algorithm description.

10. The system of claim 1, wherein the quantum element is one of a qubit and a readout resonator.

11. A method comprising:

adaptively determining a pulse and a routing signal during an operation of a quantum algorithm via a pulse generation circuit, and routing the pulse, according to the routing signal, to a first quantum element via a management circuit.

12. The method of claim 11, wherein the management circuitry is configured to route the pulse during a runtime of the quantum algorithm.

13. The method of claim 11, wherein the pulse is adaptively determined according to a characteristic of a readout pulse received from a second quantum element.

14. The method of claim 11, wherein the method comprises generating the routing signal, via the pulse generation circuit, according to one or more calculations.

15. The method of claim 11, wherein the pulse generation circuit comprises a raw pulse generation circuit and a pulse modification circuit.

16. The method of claim 15, wherein the method comprises:

storing a plurality of pulse modification settings; and providing a characteristic to control a controlled element according to a pulse modification setting of the plurality of pulse modification settings.

17. The method of claim 16, wherein the method comprises determining which of the plurality of pulse modification settings to use for processing the pulse.

18. The method of claim 16, wherein each of plurality of pulse modification settings determines a phase, frequency, and/or amplitude of the pulse.

19. The method of claim 11, wherein the route is predetermined by a quantum algorithm description.

20. The method of claim 11, wherein the quantum element is one of a qubit and a readout resonator.

* * * * *